(12) United States Patent
Nakagawa

(10) Patent No.: US 7,821,043 B2
(45) Date of Patent: Oct. 26, 2010

(54) INSULATED GATE BIPOLAR TRANSISTOR

(75) Inventor: Akio Nakagawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 530 days.

(21) Appl. No.: 11/763,558

(22) Filed: Jun. 15, 2007

(65) Prior Publication Data
US 2007/0290237 A1 Dec. 20, 2007

(30) Foreign Application Priority Data
Jun. 16, 2006 (JP) ............................. 2006-168092
Jun. 12, 2007 (JP) ............................. 2007-155341

(51) Int. Cl.
*H01L 29/80* (2006.01)
(52) U.S. Cl. ....................... 257/243; 257/370
(58) Field of Classification Search ................. 257/243, 257/263, 370, 380, E21.383, E29.198
See application file for complete search history.

(56) References Cited

U.S. PATENT DOCUMENTS

| | | | |
|---|---|---|---|
| 6,184,546 B1 * | 2/2001 | Liu et al. | ..................... 257/192 |
| 6,333,523 B1 * | 12/2001 | Sakamoto et al. | ............ 257/192 |
| 6,399,969 B1 * | 6/2002 | Twynam | ...................... 257/191 |
| 6,617,641 B2 | 9/2003 | Nakagawa et al. | |
| 6,683,343 B2 | 1/2004 | Matsudai et al. | |
| 2005/0161746 A1 * | 7/2005 | Mauder et al. | ............... 257/370 |
| 2005/0258455 A1 * | 11/2005 | Schulze et al. | ............... 257/213 |

FOREIGN PATENT DOCUMENTS

| JP | 2002-261282 | 9/2002 |
|---|---|---|
| JP | 2002-305305 | 10/2002 |

* cited by examiner

*Primary Examiner*—Howard Weiss
*Assistant Examiner*—Steven H Rao
(74) *Attorney, Agent, or Firm*—Oblon, Spivak, McClelland, Maier & Neustadt, L.L.P.

(57) ABSTRACT

An insulated gate bipolar transistor has a p-type emitter layer; an n-type buffer layer provided on the p-type emitter layer; an n-type base layer provided on the n-type buffer layer and having a higher resistivity than the n-type buffer layer; a p-type base layer provided in part of an upper surface of the n-type base layer; an n-type source layer provided in part of an upper surface of the p-type base layer; a trench extending through the n-type source layer and the p-type base layer to the n-type base layer; a gate electrode provided in the trench; and a gate insulating film provided between the gate electrode and an inner surface of the trench. The p-type emitter layer has a thickness of 5 to 50 μm and a dopant concentration of $2\times10^{16}$ to $1\times10^{18}$ cm$^{-3}$.

12 Claims, 19 Drawing Sheets

THICKNESS OF P-TYPE EMITTER LAYER  $t_{pe}$ (μm)
$C_{pe} = 1 \times 10^{17} (cm^{-3})$ THICKNESS OF P-TYPE EMITTER LAYER  $t_{pe}$ (μm)
$C_{pe} = 5 \times 10^{16} (cm^{-3})$

US 7,821,043 B2

INSULATED GATE BIPOLAR TRANSISTOR

CROSS-REFERENCE TO RELATED APPLICATIONS

This application is based upon and claims the benefit of priorities from the prior Japanese Patent Application No. 2006-168092, filed on Jun. 16, 2006, and the prior Japanese Patent Application No. 2007-155341, filed on Jun. 12, 2007; the entire contents of which are incorporated herein by reference.

BACKGROUND OF THE INVENTION

1. Field of the Invention

This invention relates to an insulated gate bipolar transistor and a method for manufacturing the same.

2. Background Art

The insulated gate bipolar transistor (hereinafter also referred to as "IGBT") is a device having a pnpn structure in a semiconductor substrate in which a current is passed along its thickness by injection of electrons from an n-type source layer and injection of holes from a p-type emitter layer.

In an IGBT, to achieve successful tradeoff between the reduction of ON voltage and the reduction of turn-off time, it is effective to restrict the amount of dopant in the entire p-type emitter layer, which is a supply source of holes, to an appropriate range. However, because the p-type emitter layer must form ohmic contact with the positive electrode, its dopant concentration needs to be increased to some extent. To this end, a technique has been developed for forming a thin p-type emitter layer to reduce the total amount of dopant with maintaining high dopant concentration (see, e.g., JP 2002-261282A).

However, this conventional technique has the following problem. In manufacturing the above IGBT having a thin p-type emitter layer, thickness variation of the p-type emitter layer due to process error leads to variation in IGBT characteristics.

SUMMARY OF THE INVENTION

According to an aspect of the invention, there is provided an insulated gate bipolar transistor comprising: a p-type emitter layer having a thickness of 5 to 50 μm and a dopant concentration of $2 \times 10^{16}$ to $1 \times 10^{18}$ cm$^{-3}$; an n-type buffer layer provided on the p-type emitter layer; an n-type base layer provided on the n-type buffer layer and having a higher resistivity than the n-type buffer layer; a p-type base layer provided in part of an upper surface of the n-type base layer; an n-type source layer provided in part of an upper surface of the p-type base layer; a trench extending through the n-type source layer and the p-type base layer to the n-type base layer; a gate electrode provided in the trench; and a gate insulating film provided between the gate electrode and an inner surface of the trench.

According to another aspect of the invention, there is provided a method for manufacturing an insulated gate bipolar transistor, the method comprising: forming an n-type buffer layer and an n-type base layer having a higher resistivity than the n-type buffer layer on a p-type substrate containing p-type dopant at a concentration of $2 \times 10^{16}$ to $1 \times 10^{18}$ cm$^{-3}$ and having a thickness of 50 μm or more; forming a p-type base layer in part of an upper surface of the n-type base layer; forming an n-type source layer in part of an upper surface of the p-type base layer; forming a trench extending through the n-type source layer and the p-type base layer to the n-type base layer; forming a gate insulating film on an inner surface of the trench; forming a gate electrode in the trench; and thinning the p-type substrate to a thickness of 5 to 50 μm.

According to another aspect of the invention, there is provided an insulated gate bipolar transistor comprising: a p-type emitter layer; an n-type buffer layer provided on the p-type emitter layer; an n-type base layer provided on the n-type buffer layer and having a higher resistivity than the n-type buffer layer; a p-type base layer provided in part of an upper surface of the n-type base layer; an n-type source layer provided in part of an upper surface of the p-type base layer; a trench extending through the n-type source layer and the p-type base layer to the n-type base layer; a gate electrode provided in the trench; and a gate insulating film provided between the gate electrode and an inner surface of the trench, a ratio of hole current passing through an interface between the n-type buffer layer and the n-type base layer versus total current passing through the interface being 0.3 to 0.5.

DETAILED DESCRIPTION OF THE INVENTION

An embodiment of the invention will now be described with reference to the drawings.

Figure 1:
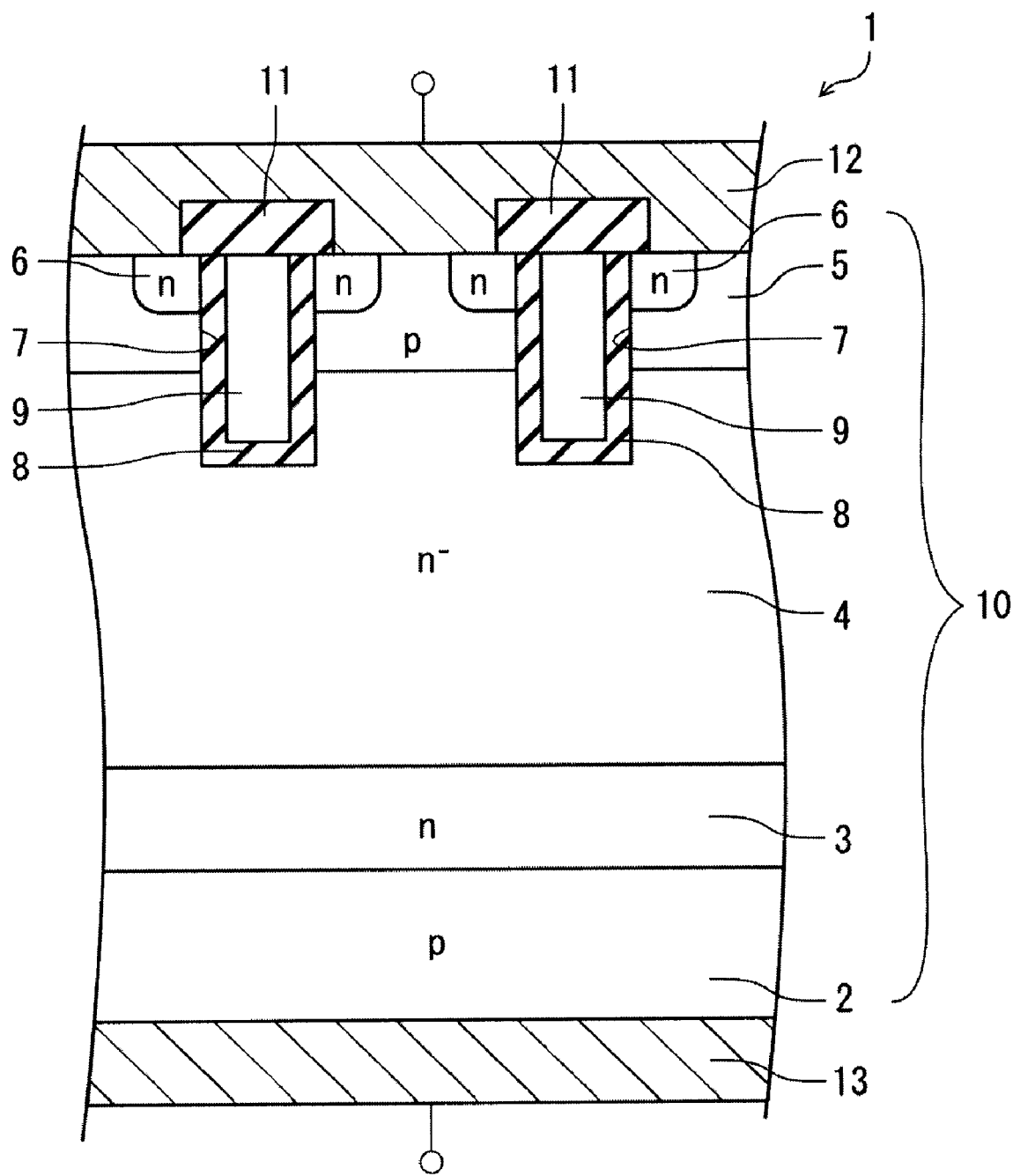
FIG. 1 is a cross-sectional view illustrating an IGBT according to an embodiment of the invention.

FIG. 1 is a cross-sectional view illustrating an IGBT according to this embodiment.

As shown in FIG. 1, the IGBT 1 according to this embodiment has a p-type emitter layer 2. On the p-type emitter layer 2 is provided an n-type buffer layer 3, on which is provided an n-type base layer 4. The n-type base layer 4 has a lower dopant concentration and a higher resistivity than the n-type buffer layer 3. A p-type base layer 5 is provided in part of the upper surface of the n-type base layer 4. An n-type source layer 6 is provided in part of the upper surface of the p-type base layer 5. The p-type emitter layer 2, the n-type buffer layer 3, the n-type base layer 4, the p-type base layer 5, and the n-type source layer 6 are all formed from doped silicon, for example.

In the upper surface of a laminated body 10 composed of the p-type emitter layer 2, the n-type buffer layer 3, the n-type base layer 4, the p-type base layer 5, and the n-type source layer 6, that is, in the exposed surface of the p-type base layer 5 and the n-type source layer 6, a trench 7 is formed to extend through the n-type source layer 6 and the p-type base layer 5 to the n-type base layer 4. Furthermore, a gate insulating film 8 is formed on the inner surface of the trench 7. A gate electrode 9 is formed on the gate insulating film 8 to fill in the trench 7. That is, the gate electrode 9 is provided in the trench 7, and the gate insulating film 8 is provided between the gate electrode 9 and the inner surface of the trench 7. Thus the gate electrode 9 is isolated by the gate insulating film 8 from the n-type base layer 4, the p-type base layer 5, and the n-type source layer 6. For example, the gate insulating film 8 is formed from silicon oxide, and the gate electrode 9 is formed from polysilicon.

On the upper surface of the laminated body 10, an insulating film 11 made of e.g. TEOS (Tetra-Ethyl-Ortho-Silicate ($Si(OC_2H_5)_4$)) is provided on a region covering the gate electrode 9. A cathode electrode 12 made of metal film covers the upper surface of the laminated body 10 and the insulating film 11. Thus the cathode electrode 12 is connected to the n-type source layer 6 and the p-type base layer 5. A control electrode (not shown) connected to the gate electrode 9 is also provided on the upper surface of the laminated body 10. On the other hand, an anode electrode 13 made of metal film is provided on the lower surface of the laminated body 10 and connected to the p-type emitter layer 2.

The p-type emitter layer 2 has a thickness of 5 to 50 μm (microns), specifically 10 to 50 μm, more specifically 15 to 50 μm, and still more specifically 20 to 30 μm. The p-type emitter layer 2 has a dopant concentration of $2 \times 10^{16}$ to $1 \times 10^8$ cm$^{-3}$, specifically $2 \times 10^{16}$ to $3 \times 10^{17}$ cm$^{-3}$, and more specifically $1 \times 10^{17}$ cm$^{-3}$. In the p-type emitter layer 2, the dopant concentration is generally uniform except in the vicinity of the interface with the n-type buffer layer 3. This is because, as described later, the p-type emitter layer 2 is formed by thinning a p-type substrate containing p-type dopant generally uniformly. In the vicinity of the interface with the n-type buffer layer 3, the dopant concentration slightly decreases because part of the dopant is lost due to diffusion. The "dopant concentration" used herein refers to the net dopant concentration contributing to supplying p-type or n-type carriers.

To achieve sufficient static breakdown voltage, the amount of dopant in the n-type buffer layer 3 and the n-type base layer 4, that is, the dopant concentration in the n-type buffer layer 3 and the n-type base layer 4 integrated in the current direction, is preferably $3 \times 10^{12}$ cm$^{-2}$ or more. More preferably, this integrated value is $2 \times 10^{13}$ cm$^{-2}$ or less. The dopant concentration in the n-type buffer layer 3 is configured to be lower than the dopant concentration in the p-type emitter layer 2.

Next, a method for manufacturing an IGBT 1 according to this embodiment is described.

Figure 2:
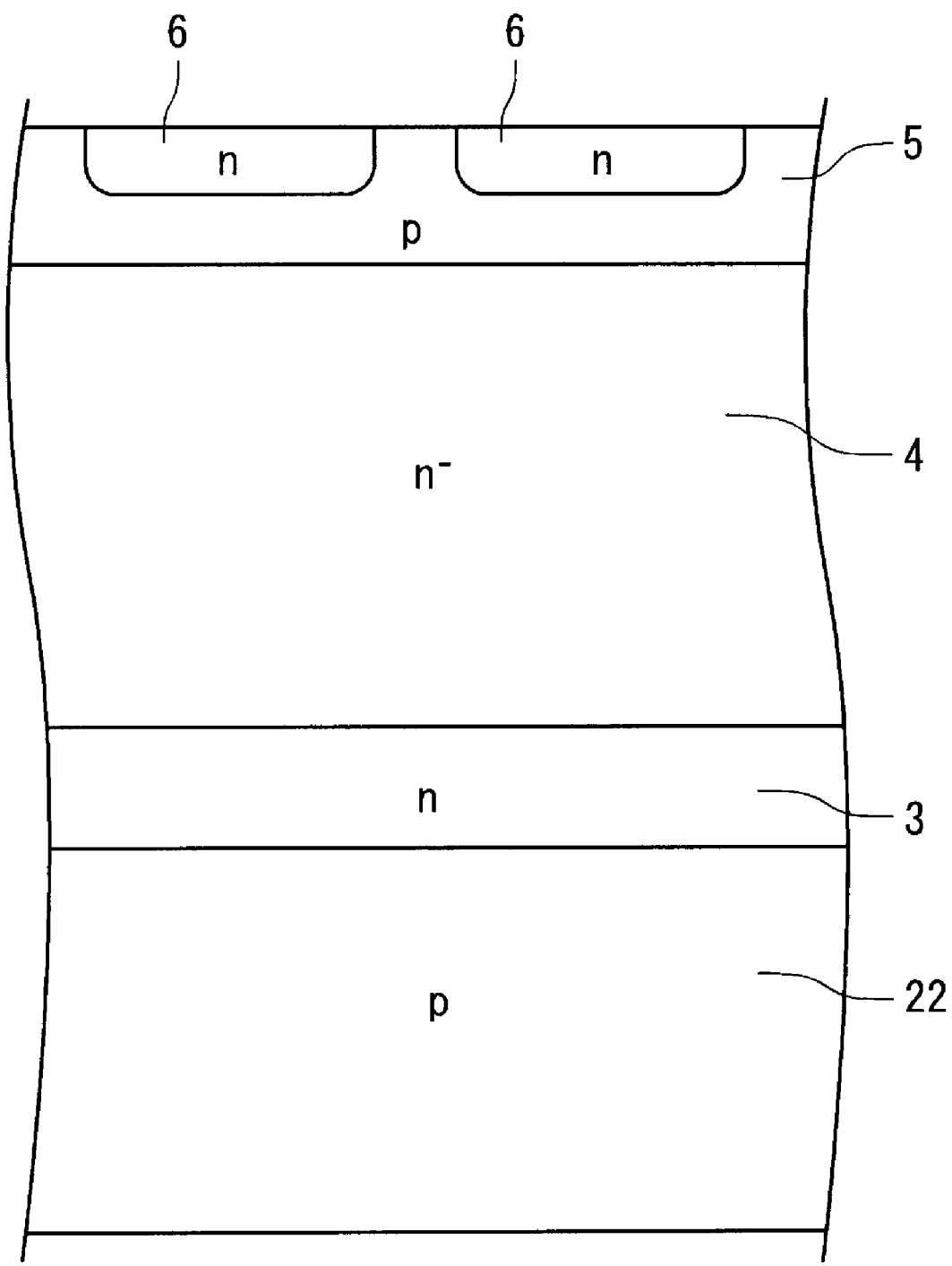
FIGS. 2 to 4 are process cross-sectional views illustrating a method for manufacturing an IGBT according to this embodiment.
Figure 3:
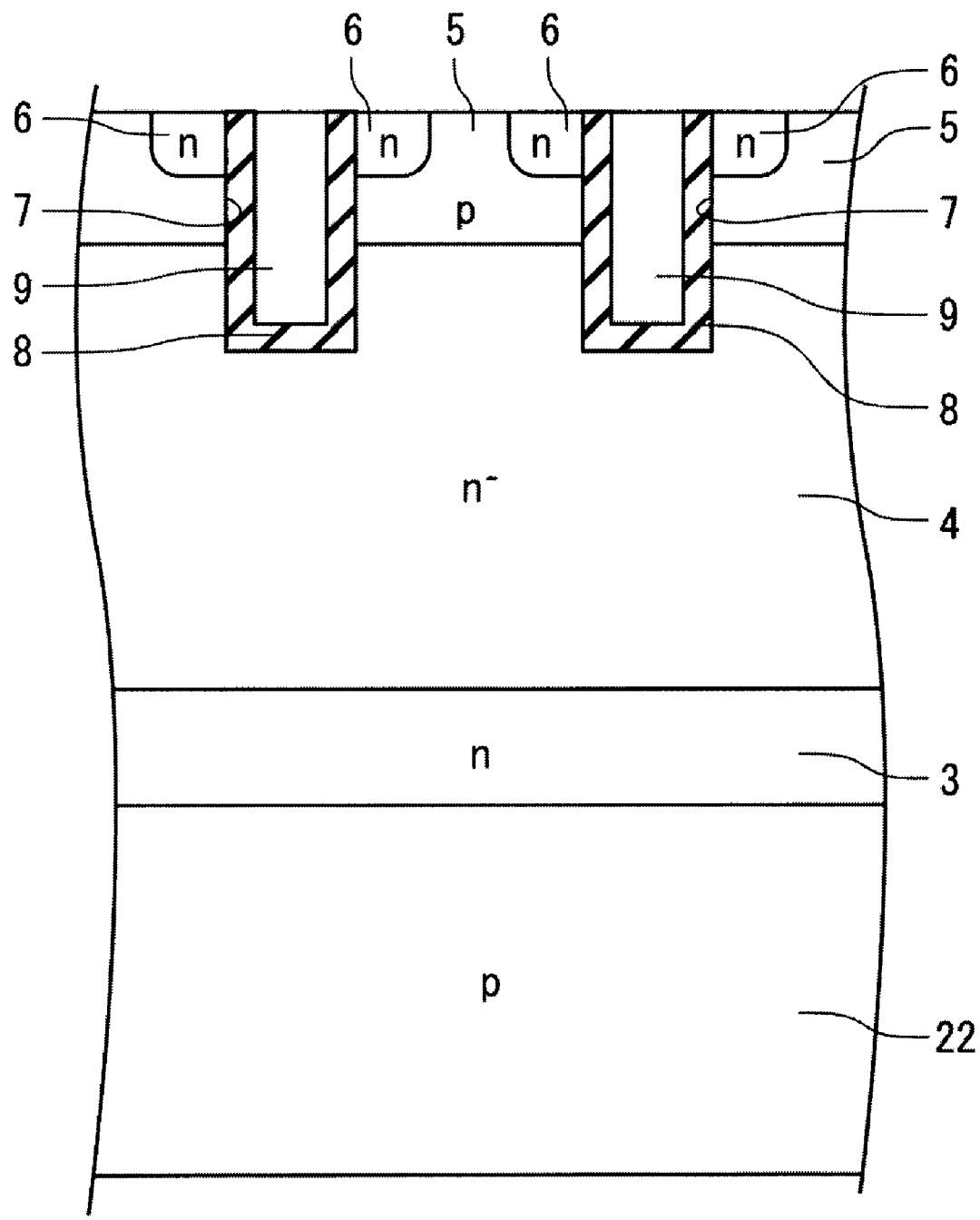
Figure 4:
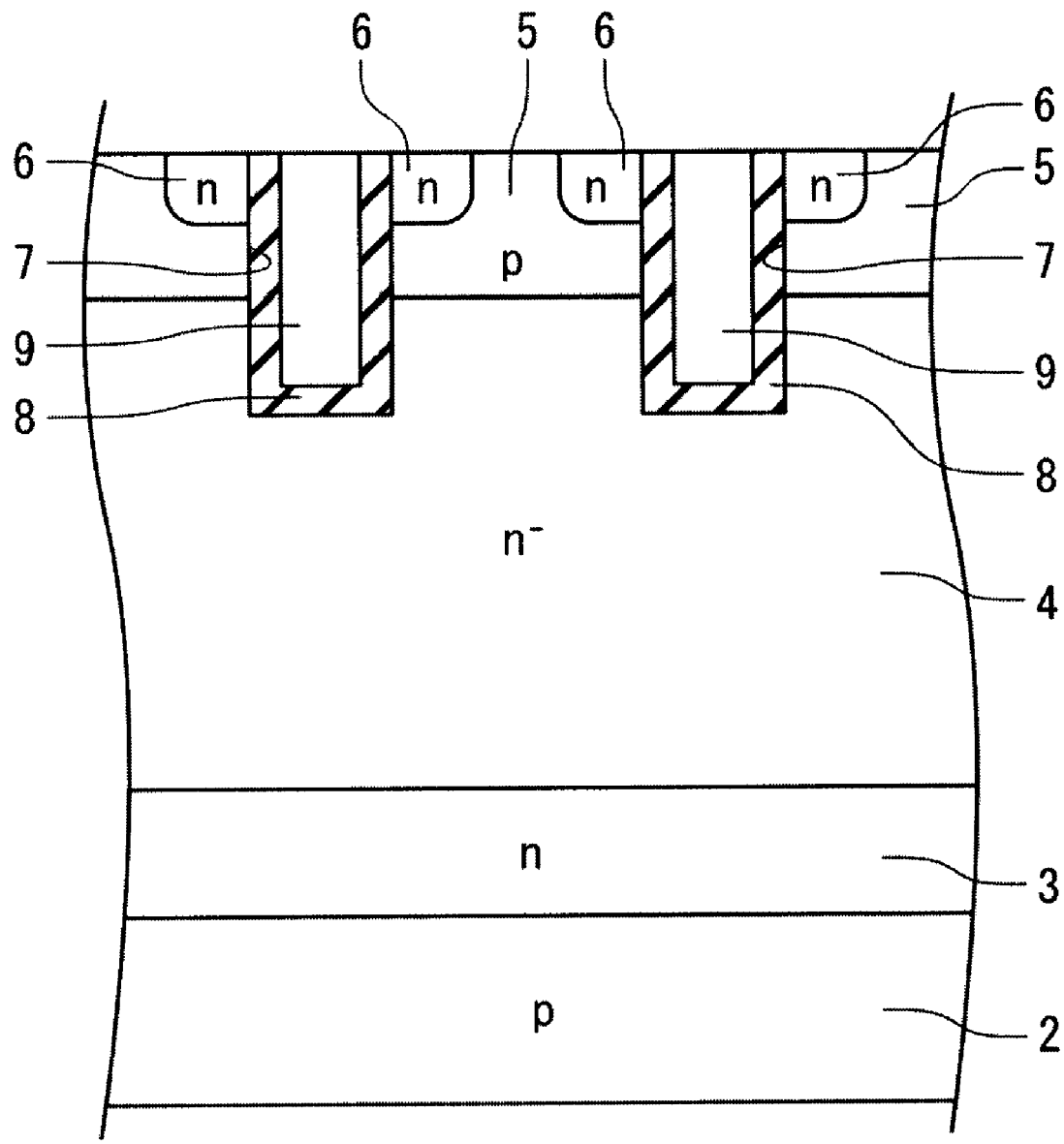

FIGS. 2 to 4 are cross-sectional views illustrating a method for manufacturing an IGBT according to this embodiment.

First, as shown in FIG. 2, a p-type substrate 22 is prepared. For example, the p-type substrate 22 is a silicon substrate uniformly doped with p-type dopant, and its thickness is larger than 50 μm, e.g. several hundred μm. The p-type substrate 22 has a dopant concentration of $2 \times 10^{16}$ to $1 \times 10^{18}$ cm$^{-3}$, specifically $2 \times 10^{16}$ to $3 \times 10^{17}$ cm$^{-3}$, and more specifically $1 \times 10^{17}$ cm$^{-3}$.

Next, an n-type buffer layer 3 and an n-type base layer 4 made of silicon doped with n-type dopant are formed on the p-type substrate 22. Here, the n-type base layer 4 is configured to have a lower dopant concentration and a higher resistivity than the n-type buffer layer 3. By conventional methods, a p-type base layer 5 is formed in part of the upper surface of the n-type base layer 4 by ion implantation and diffusion, and an n-type source layer 6 is formed in part of the upper surface of the p-type base layer 5 by ion implantation and diffusion.

Next, as shown in FIG. 3, in the upper surface of a laminated body composed of the p-type substrate 22, the n-type buffer layer 3, the n-type base layer 4, the p-type base layer 5, and the n-type source layer 6, a trench 7 is formed to extend through the n-type source layer 6 and the p-type base layer 5 to the n-type base layer 4. Then, by heat treatment in an oxidizing atmosphere, for example, a gate insulating film 8 made of silicon oxide is formed on the inner surface of the trench 7. Next, a gate electrode 9 is formed by filling in the trench 7 with conductive material such as polysilicon and then removing the conductive material deposited on the laminated body.

Next, as shown in FIG. 4, by grinding the lower surface of the p-type substrate 22 (see FIG. 3), the p-type substrate 22 is thinned to a thickness of 5 to 50 µm. Thus a p-type emitter layer 2 having a thickness of 5 to 50 µm is formed. The thickness of the p-type emitter layer 2 is preferably 10 to 50 µm, more preferably 15 to 50 µm, and still more preferably 20 to 30 µm.

Next, as shown in FIG. 1, a TEOS film is formed and patterned on the laminated body 10 so that only a region of the TEOS film including the directly overlying region of the gate electrode 9 is selectively left. Thus an insulating film 11 is formed. Then a cathode electrode 12 and a control electrode (not shown) are formed so as to cover the laminated body 10 and the insulating film 11. Here, the cathode electrode 12 is configured to be connected to the p-type base layer 5 and the n-type source layer 6, and the control electrode is configured to be connected to the gate electrode 9. On the other hand, an anode electrode 13 is formed on the lower surface of the laminated body 10 so as to be connected to the p-type emitter layer 2. Thus the IGBT 1 is fabricated.

Next, the operation of the IGBT 1 is described.

To broaden the load short circuit SOA (Safe Operation Area) of an IGBT to the greatest extent possible, it is effective to optimize the ratio between electron current and hole current in the IGBT.

The optimum ratio between electron current and hole current in the IGBT is described below. First, the "MOSFET mode operation" is defined. At the interface between the n-type buffer layer 3 and the n-type base layer 4 shown in FIG. 1, the ratio of hole current to total current passing through this interface is referred to as injection efficiency γ. Note that the injection efficiency γ is equal to the product of the injection efficiency of the p-type emitter layer and the transport efficiency of the n-type buffer layer 3. On the other hand, let $\mu_n$ be electron mobility and $\mu_p$ hole mobility, and $\gamma_{MOS}$ is defined as the following equation (1). Then the "MOSFET mode operation" is defined as a state satisfying $\gamma < \gamma_{MOS}$.

$$\gamma_{MOS} = \mu_p/(\mu_n + \mu_p) \tag{1}$$

Because electron and hole mobility are functions of electric field strength, the value of $\gamma_{MOS}$ greatly varies as the electric field in the IGBT varies.

Figure 5:
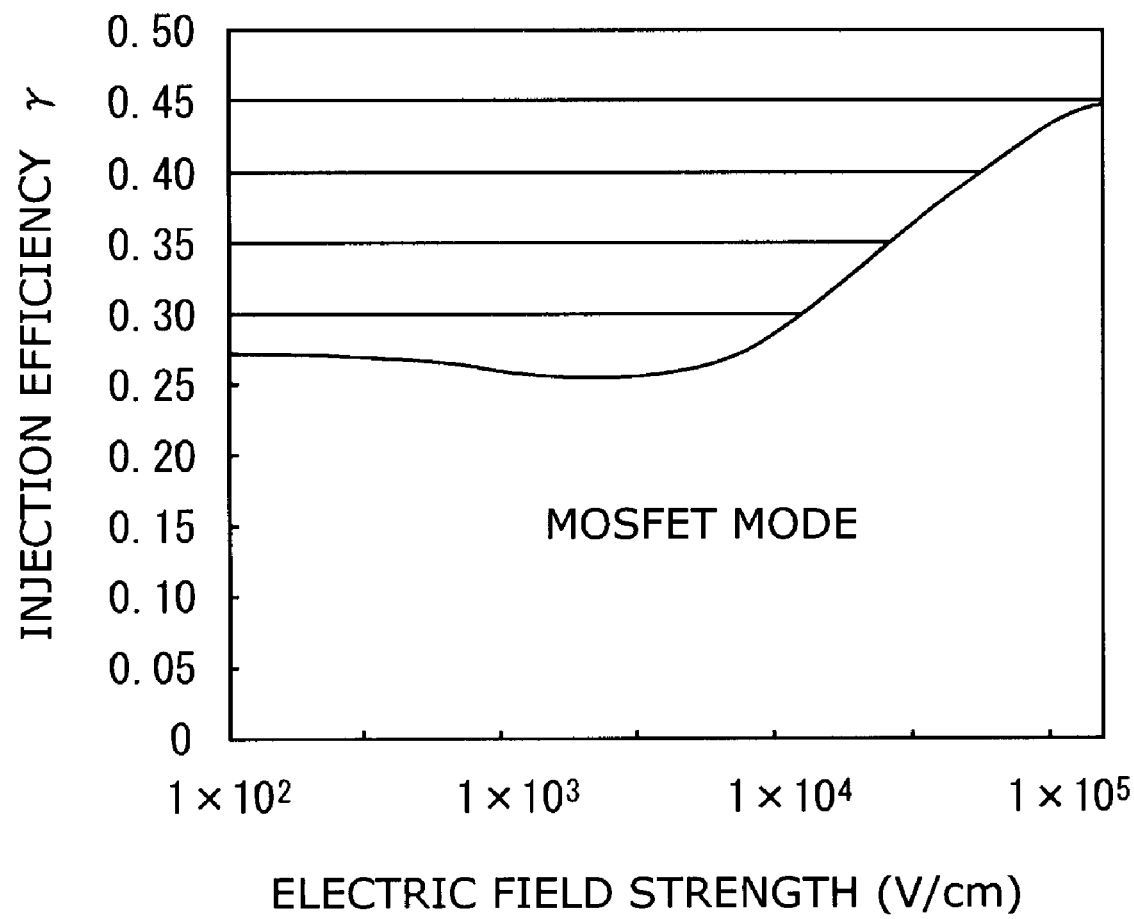
FIG. 5 is a graph showing the electric field dependence of $\gamma_{MOS}$ where the horizontal axis represents electric field strength and the vertical axis represents the value of $\gamma_{MOS}$.

FIG. 5 is a graph showing the electric field dependence of $\gamma_{MOS}$ where the horizontal axis represents electric field strength and the vertical axis represents the value of $\gamma_{MOS}$.

As shown in FIG. 5, as forward voltage and internal electric field strength vary, the operation mode of the IGBT also changes, since the MOSFET mode operation is defined as a region satisfying $\gamma < \gamma_{MOS}$.

Figure 6:
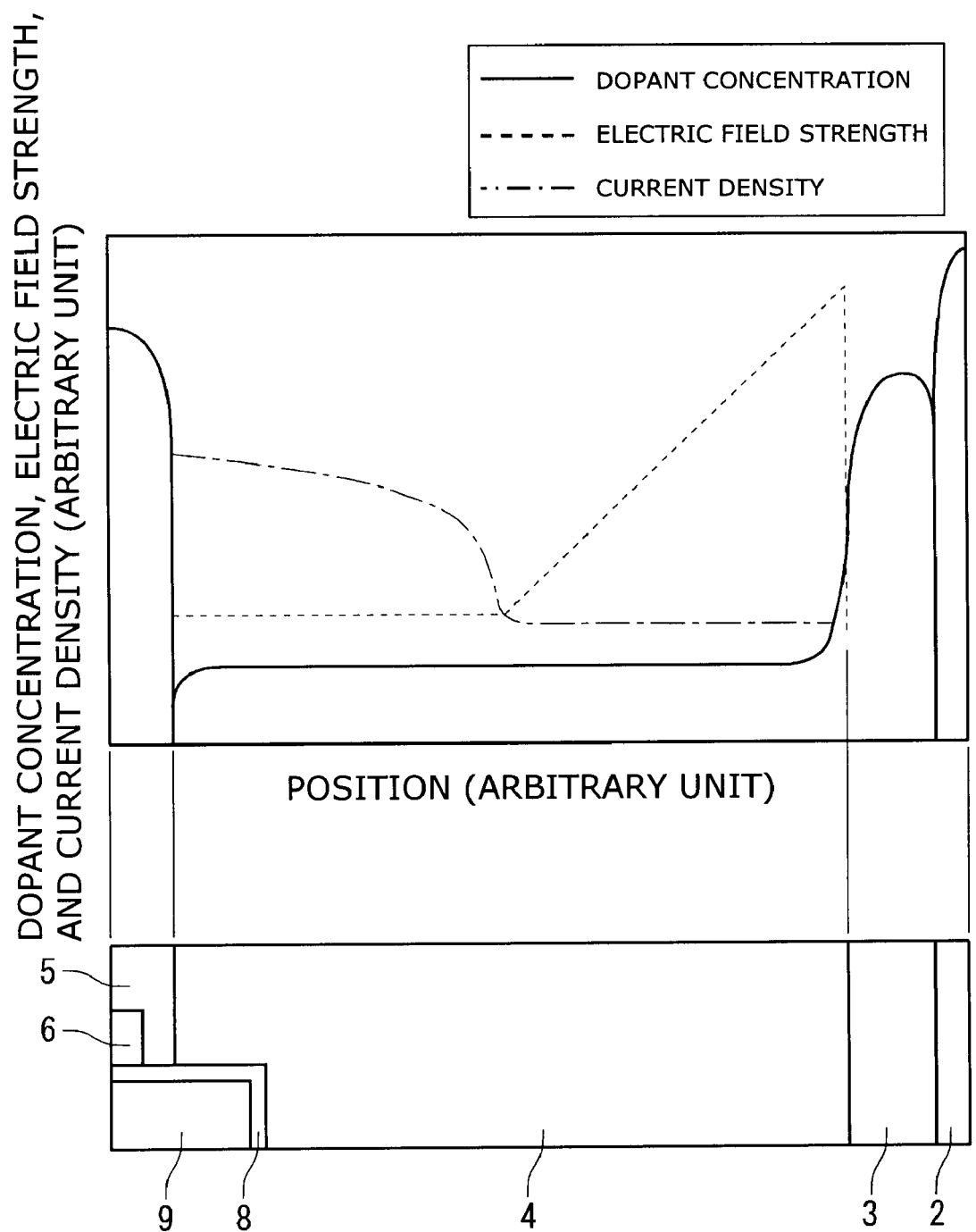
FIG. 6 is a graph showing the state of an IGBT under high forward voltage where the horizontal axis represents position along the current in the IGBT and the vertical axis represents dopant concentration, electric field strength, and current density.

FIG. 6 is a graph showing the state of an IGBT under high forward voltage where the horizontal axis represents position along the current in the IGBT and the vertical axis represents dopant concentration, electric field strength, and current density. FIG. 6 also includes a schematic view showing the configuration of the IGBT in correspondence with the horizontal axis of this graph. The reference numerals in this schematic view are the same as those in FIG. 1.

As shown in FIG. 6, when an extremely high forward voltage is applied to the IGBT, a strong electric field is first produced at the interface between the p-type base layer 5 and the n-type base layer 4. However, for a high current density, a strong electric field occurs also on the anode side. The reason for this is described below.

In a thin wafer PTIGBT (Punch Through IGBT), the lifetime of carriers in the n-type base layer is configured to be sufficiently long. It is assumed here that the ratio of hole current density to total current density is uniform throughout the high electric field region. If the high electric field region extends throughout the n-type base layer and reaches the n-type buffer layer, this ratio is equal to injection efficiency γ. Let n and p be electron and hole density in the high electric field region, respectively. Then the electron density n and hole density p can be calculated by the following equations (2) to (4):

$$\gamma = J_p/J \tag{2}$$

$$n = J_n/(q \times v_e) \tag{3}$$

$$p = J_p/(q \times v_h) \tag{4}$$

where J is the total current density, $J_n$ is the electron current density, $J_p$ is the hole current density, $v_e$ is the electron velocity, $v_h$ is the hole velocity, and q is the charge.

Given the above equations (2) to (4), the net amount of charge ρ in the high electric field region is given as a function of donor density $N_D$ expressed in the following equation (5):

$$\rho = N_D + p - n = N_D + \{\gamma/v_h + (\gamma - 1)/v_e\} \times J/q \tag{5}$$

If $\gamma < \gamma_{MOS}$, the second term on the right hand side of the above equation (5) is negative. Hence, if the current density J increases, the net amount of charge ρ decreases from a positive value and eventually becomes negative. The current density J obtained when ρ=0 is referred to as the critical current density $J_c$. When $J=J_c$, ρ=0 and the electric field strength is flat along the current direction. In this case, solving the above equation (5) for J yields the following equation (6):

$$J_c = q \times N_D/\{(1-\gamma)/v_e - \gamma/v_h\} \tag{6}$$

Once the net amount of charge p becomes negative, the electric field peak is shifted toward the interface between the n-type buffer layer and the n-type base layer.

Figure 7A:
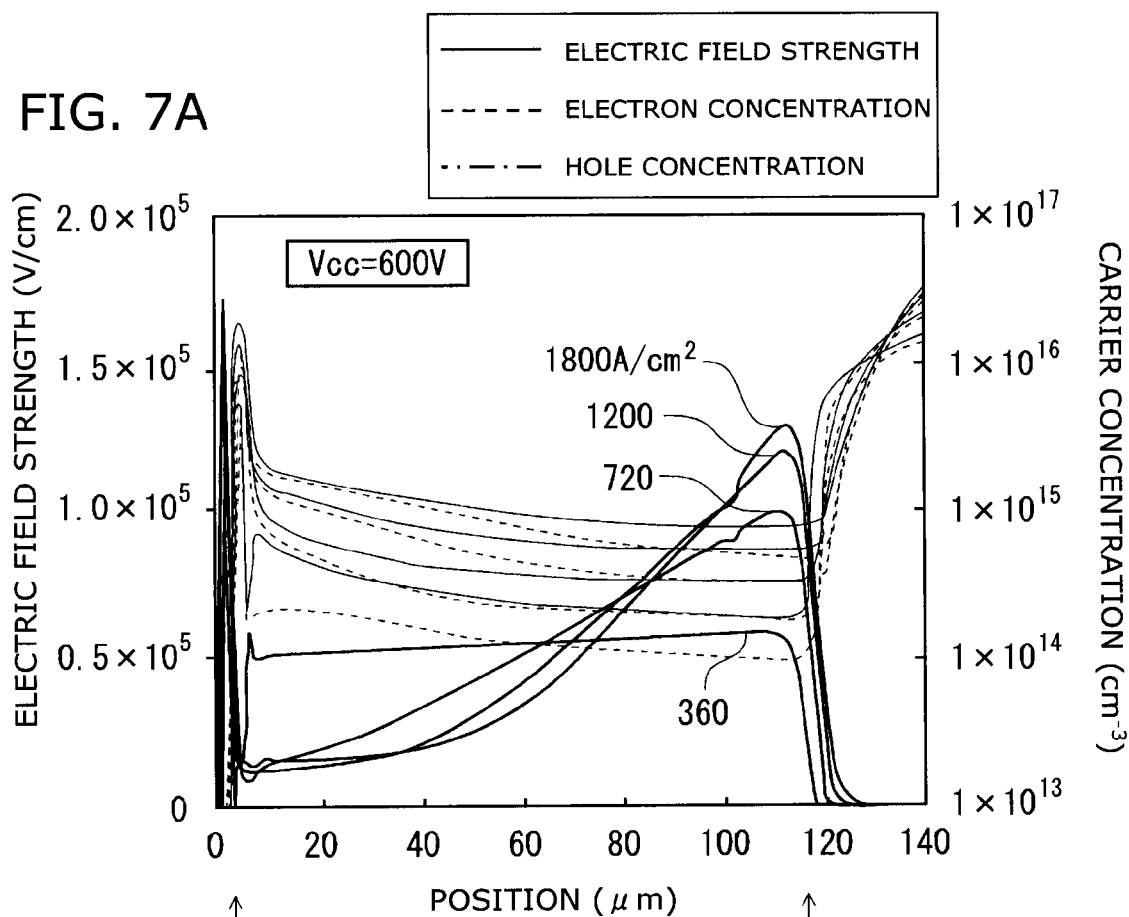
FIG. 7A is a graph showing electric field distribution and carrier concentration distribution in an IGBT where the horizontal axis represents position along the current in the IGBT and the vertical axis represents electric field strength and carrier concentration simulated by TCAD.
Figure 7B:
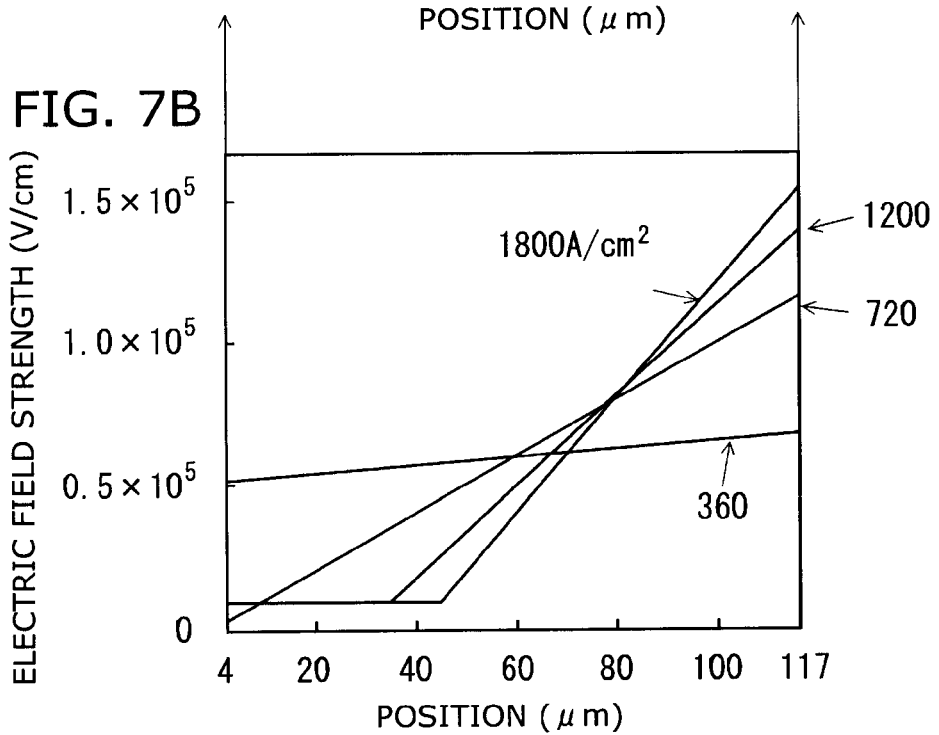
FIG. 7B is a graph showing electric field distribution in the IGBT where the horizontal axis represents position along the current in the IGBT and the vertical axis represents analytically calculated electric field strength.

FIG. 7A is a graph showing electric field distribution and carrier concentration distribution in an IGBT where the horizontal axis represents position along the current in the IGBT and the vertical axis represents electric field strength and carrier concentration simulated by TCAD. FIG. 7B is a graph showing electric field distribution in the IGBT where the horizontal axis represents position along the current in the IGBT and the vertical axis represents analytically calculated electric field strength. FIG. 7A shows the case where a forward voltage of 600 V is applied to a thin wafer PTIGBT of 1200 V type, showing the portion extending from the p-type base layer 5 and the n-type source layer 6 to the p-type emitter layer 2 shown in FIG. 1. On the other hand, FIG. 7B shows only the portion of the n-type base layer 4, that is, the portion extending from the lower surface of the gate insulating film 8 to the interface between the n-type base layer 4 and the n-type buffer layer 3 shown in FIG. 1. Here, the numerical values indicated in FIGS. 7A and 7B are illustrative only.

The calculation result shown in FIG. 7B is in good agreement with the simulation result shown in FIG. 7A. The method for this calculation is described later.

As described above, when $J=J_c$, the electric field strength is uniform in the current direction. When the current density J further increases beyond the critical current density $J_c$, an extremely strong electric field occurs at the interface between the n-type buffer layer 3 (see FIG. 1) and the n-type base layer 4 (see FIG. 1). If the peak of this electric field at the interface between the n-type buffer layer and the n-type base layer exceeds a critical value $E_c$, avalanche breakdown occurs. This phenomenon is similar to the secondary breakdown in an npn bipolar transistor. The ON-state breakdown voltage varies with the increase of current density and the variation in the net amount of charge ρ.

As shown in FIGS. 7A and 7B, in an active device, the value of injection efficiency γ is not constant, but depends on the operating condition. For example, with the increase of current density, the value of γ varies in the range of 0.28 to 0.36. This is because part of the n-type buffer layer vanishes due to the increased peak of electric field strength at the interface between the n-type buffer layer and the n-type base layer. As a result, the transport coefficient $\alpha_T$ in the n-type buffer layer increases.

Figure 8:
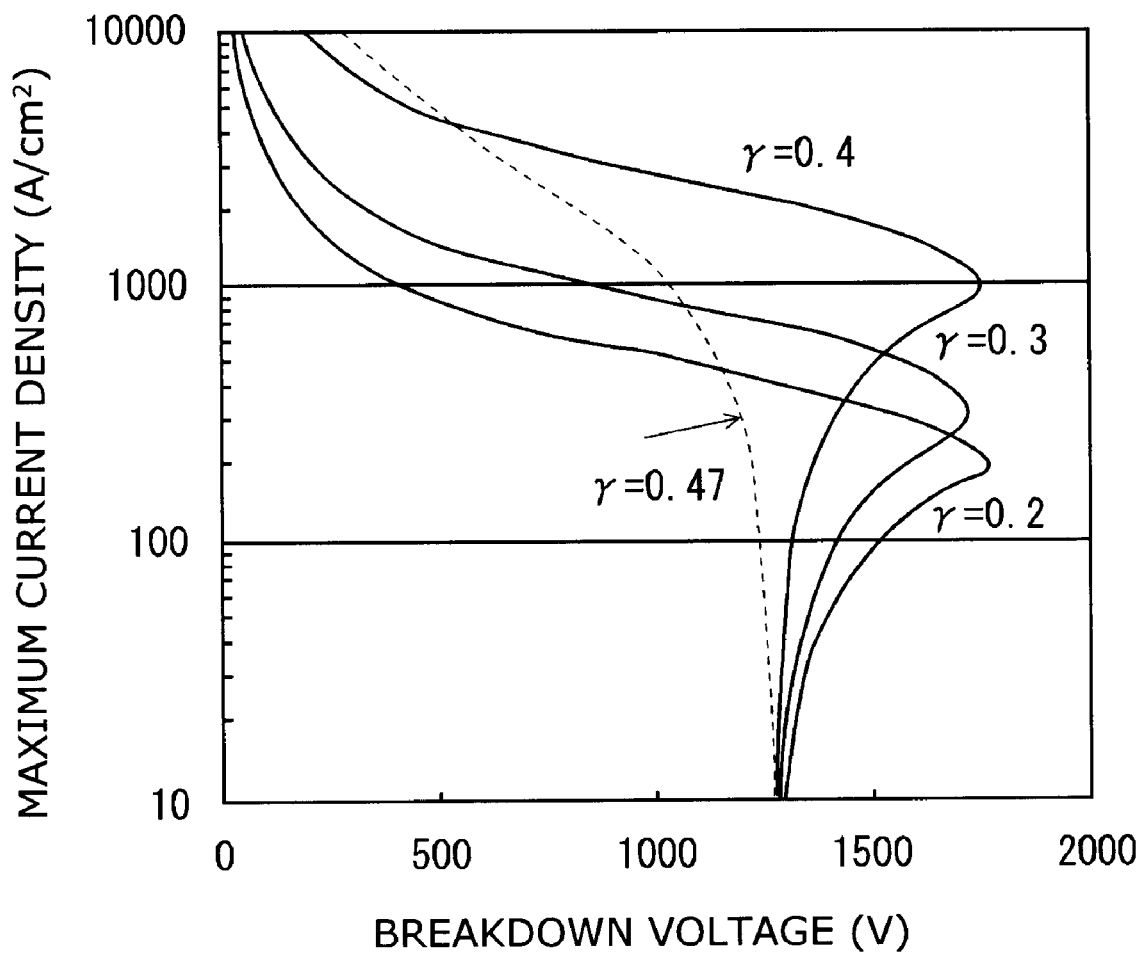
FIG. 8 is a graph showing the boundary of the load short circuit SOA determined analytically by using the injection efficiency γ as a parameter where the horizontal axis represents ON-state breakdown voltage and the vertical axis represents maximum current density.

FIG. 8 is a graph showing the boundary of the load short circuit SOA determined analytically by using the injection efficiency γ as a parameter where the horizontal axis represents ON-state breakdown voltage and the vertical axis represents maximum current density. FIG. 8 shows the case for a thin wafer PTIGBT of 1200 V type where the n-type base layer has a dopant concentration $N_D$ of $7 \times 10^{13}$ cm$^{-3}$ and a thickness of 100 μm. The breakdown voltage is calculated assuming that this PTIGBT has a pnn diode structure with the dose amount in the n-region being estimated by the above equation (5). The critical value $E_c$ of electric field strength peak at which breakdown occurs is set to $1.8 \times 10^5$ V/cm.

It is presumed that the ON-state breakdown voltage reaches a peak value when the current density J equals the critical current density $J_c$. It is also presumed that the load short circuit SOA is significantly degraded if the value of injection efficiency γ decreases. On the other hand, when the injection efficiency γ is greater than 0.45, the net amount of charge in the n-type base layer always remains positive, and the ON-state breakdown voltage monotonically decreases with the increase of current density J. FIG. 8 also shows the case where γ=0.47. When the value of γ approaches 0.45 from 0.47, SOA rapidly increases. In theory, when the value of injection efficiency γ is equal to $V_h/(V_h+v_e)$, i.e., when γ=0.45, the load short circuit SOA goes to infinity.

Figure 9:
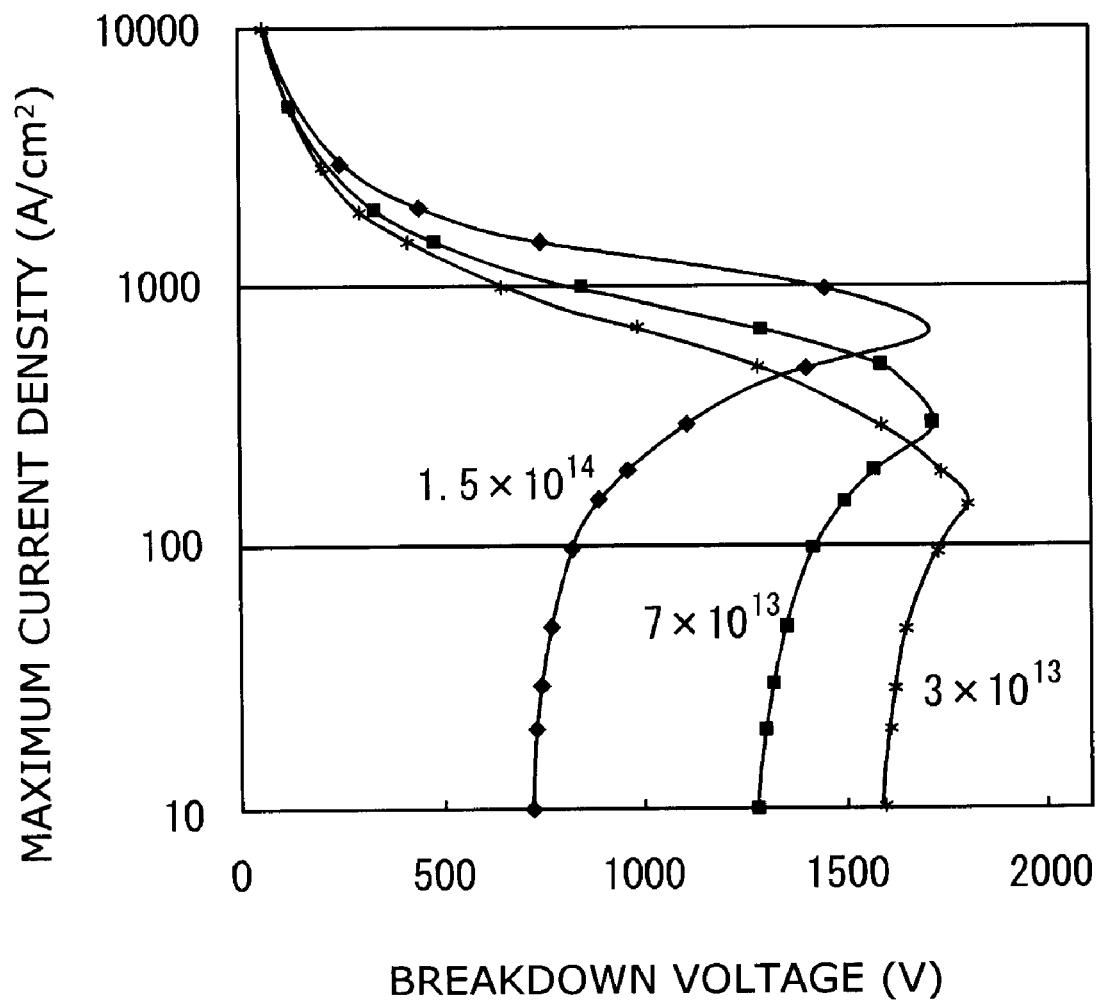
FIG. 9 is a graph showing the boundary of the load short circuit SOA calculated by using dopant concentration $N_D$ in the n-type base layer as a parameter where the horizontal axis represents ON-state breakdown voltage and the vertical axis represents maximum current density.

FIG. 9 is a graph showing the boundary of the load short circuit SOA calculated by using dopant concentration $N_D$ in the n-type base layer as a parameter where the horizontal axis represents ON-state breakdown voltage and the vertical axis represents maximum current density. The numbers in the figure represent the dopant concentration $N_D$ (cm$^{-3}$) in the n-type base layer.

It is presumed from FIG. 9 that the load short circuit SOA increases as the dopant concentration in the n-type base layer increases.

Figure 10:
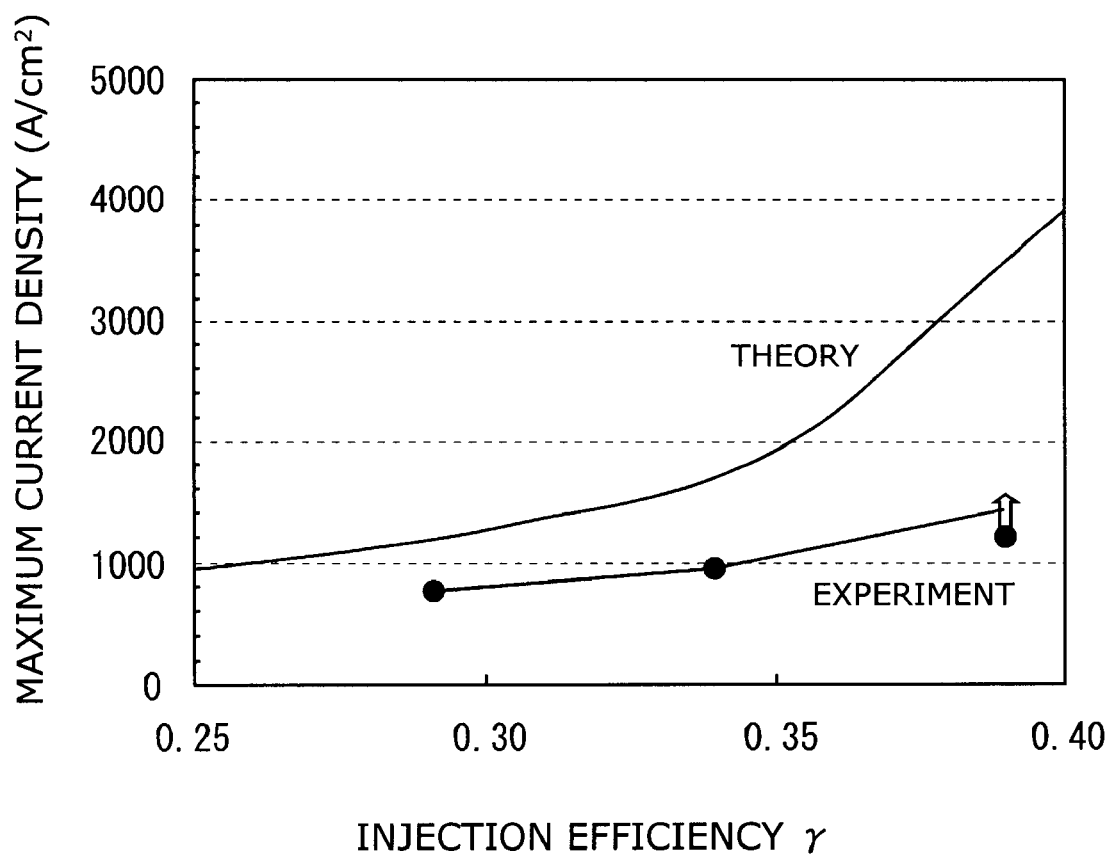
FIG. 10 is a graph showing the injection efficiency dependence of maximum current density determined theoretically and experimentally where the horizontal axis represents injection efficiency γ and the vertical axis represents maximum current density.

FIG. 10 is a graph showing the injection efficiency dependence of maximum current density determined theoretically and experimentally where the horizontal axis represents injection efficiency γ and the vertical axis represents maximum current density. FIG. 10 shows the case where a forward voltage of 600 V is applied.

Figure 11:
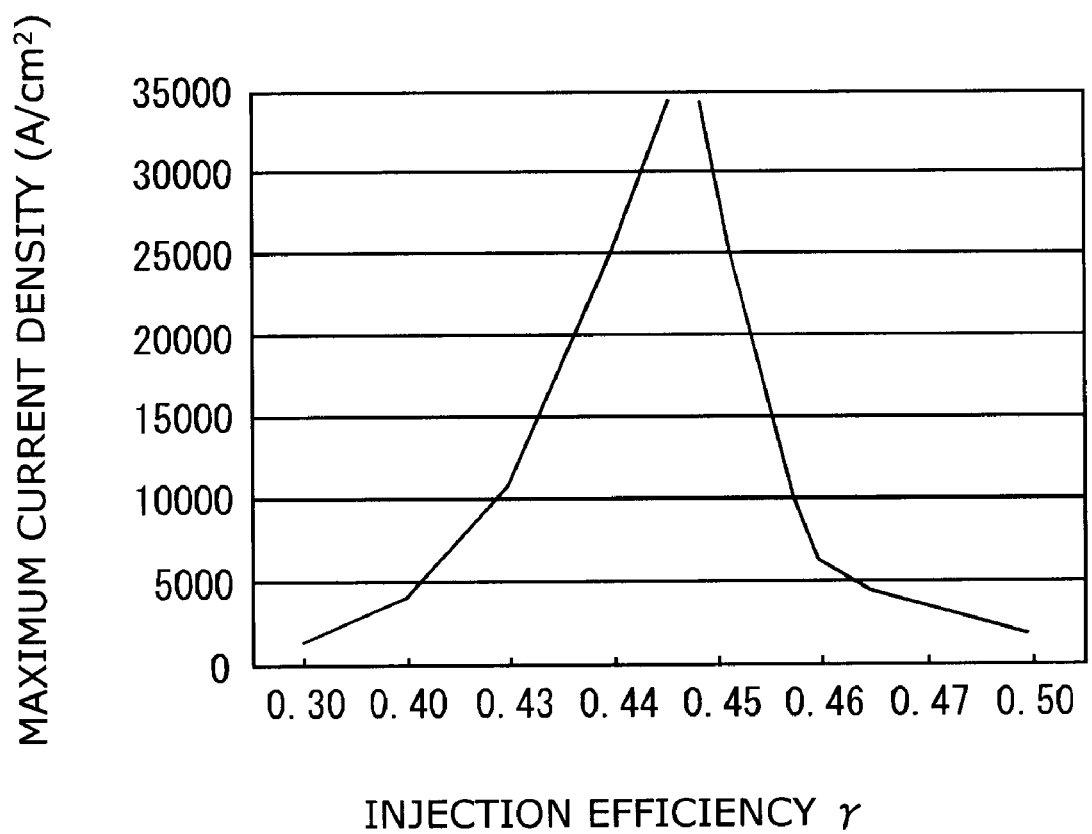
FIG. 11 is a graph showing the injection efficiency dependence of maximum current density determined by another experiment where the horizontal axis represents injection efficiency γ and the vertical axis represents maximum current density.

FIG. 11 is a graph showing the injection efficiency dependence of maximum current density determined by another experiment where the horizontal axis represents injection efficiency γ and the vertical axis represents maximum current density.

In FIGS. 10 and 11, the result of theoretical calculation reveals that the load short circuit SOA increases as injection efficiency γ approaches the value of $V_h/(V_h+v_e)$. The experimental results also exhibit the same trend.

Thus, to maximize the load short circuit SOA, it is effective to avoid impact ionization by setting $J=J_c$ so that a uniform electric field is applied to the n-type base layer during passage of large current. At this time, γ=0.45. The load short circuit SOA decreases whether the value of γ is smaller or larger than 0.45. Here, the load short circuit SOA decreases relatively gradually when the value of γ decreases from 0.45, whereas the load short circuit SOA decreases relatively rapidly when the value of γ increases from 0.45. Hence, for a high injection with a current density of e.g. 2000 A/cm² or more, the value of γ is preferably in the range of 0.3 to 0.5. For a current density of e.g. 10000 A/cm² or more, the value of γ is more preferably in the range of 0.430 to 0.457.

Thus, according to analysis of an IGBT based on a one-dimensional model, the load short circuit SOA is maximized for an injection efficiency γ of 0.45, and it turns out to be preferable to design an IGBT so that the value of γ falls within the above range including 0.45. However, according to analysis of an IGBT based on a two-dimensional model using a device simulator, it turns out that the value of injection efficiency γ is preferably in the range of 0.385 to 0.399. This is because analysis based on a two-dimensional model allows the effect of holes accumulated in the non-operating portion of the IGBT to be taken into consideration, yielding a result which is slightly different from the result of analysis based on the one-dimensional model.

It is possible to control the value of injection efficiency γ to within the above preferable range by controlling the amount of dopant in the p-type emitter layer. However, as described above in the Background Art section, because the p-type emitter layer must form ohmic contact with the anode electrode, the dopant concentration in the p-type emitter layer needs to be not less than a certain value. It is possible to control the amount of dopant in the p-type emitter layer to within a suitable range by thinning the p-type emitter layer. Then, however, with the variation in thickness of the p-type emitter layer due to manufacturing process error, the amount of dopant in the p-type emitter layer also varies. Thus the value of injection efficiency γ varies, and the magnitude of the load short circuit SOA also varies.

However, in this embodiment, as shown in FIG. 1, the p-type emitter layer 2 is thicker than conventional. Then the dopant concentration in the p-type emitter layer 2 is controlled to control the value of injection efficiency γ, and hence the magnitude of the load short circuit SOA. Because the p-type emitter layer 2 is sufficiently thickened, electrons in the n-type buffer layer 3 do not reach the anode electrode 13 through the p-type emitter layer 2. Thus the electron current flowing from the n-type buffer layer 3 to the p-type emitter layer 2 decreases, and the proportion of hole current to total current, i.e., injection efficiency γ, increases by that much. Here, the portion of the p-type emitter layer 2 on the side opposite to the n-type buffer layer 3 does not substantially contribute to the flow of electron current even if the portion is varied in thickness. Thus the injection efficiency γ can be controlled simply by using the dopant concentration in the portion of the p-type emitter layer 2 on the side of the n-type buffer layer 3. Because dopant concentration is more easily controlled than film thickness, the value of injection efficiency γ can be controlled stably and precisely according to this embodiment.

However, an extremely large thickness of the p-type emitter layer results in a large resistance of the p-type emitter layer, which increases the ON resistance of the IGBT. Hence the p-type emitter layer is preferably as thin as possible on the condition that its thickness exceeds about the electron diffusion length. The diffusion length L of carriers is given by the following equation (7):

$$L = \sqrt{(D \times t)} \qquad (7)$$

where D and t is the diffusion coefficient and the lifetime of the carrier, respectively.

The diffusion coefficient D is given by the following equation (8):

$$D = \mu \times (k \times T/q) \quad (8)$$

where $\mu$ is the electron mobility, k is the Boltzmann constant, T is the absolute temperature, and q is the charge. The value of $k \times T/q$ is 0.025, for example.

Figure 12:
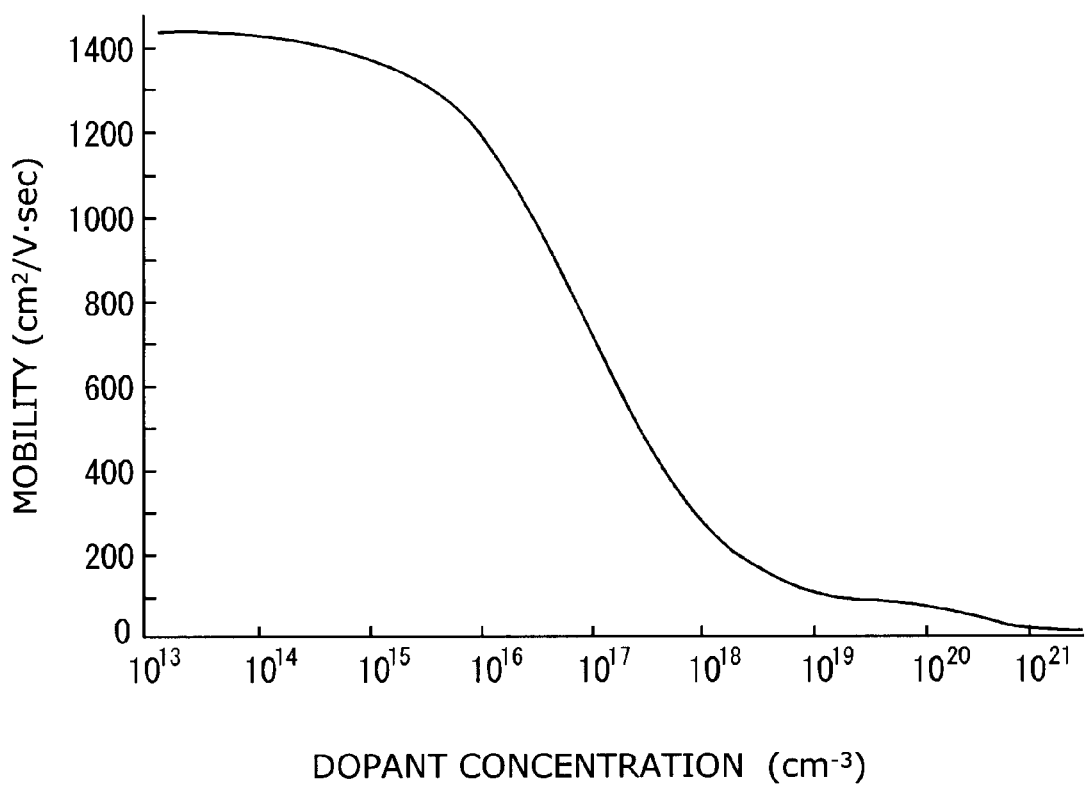
FIG. 12 is a graph showing the dopant concentration dependence of mobility μ where the horizontal axis represents dopant concentration and the vertical axis represents mobility μ.

FIG. 12 is a graph showing the dopant concentration dependence of mobility where the horizontal axis represents dopant concentration and the vertical axis represents mobility $\mu$.

Next, the preferable range of thickness and dopant concentration for the p-type emitter layer derived from the above discussion is described.

Thickness of the p-type Emitter Layer: 5 to 50 μm

The diffusion length of electrons in the p-type emitter layer depends on the electron lifetime. However, if the p-type emitter layer has a thickness of 5 μm or more, the dopant concentration in the p-type emitter layer on the n-type buffer layer side has a more dominant effect on injection efficiency γ than the total amount of dopant in the p-type emitter layer. This reduces the effect of the thickness of the p-type emitter layer on the injection efficiency γ. One reason for this is that, when the p-type emitter layer has a thickness of 5 μm or more, the thickness variation can be restricted to within 10% because the thickness of the p-type emitter layer can be controlled to a precision of about 0.5 μm by existing processing techniques in grinding a p-type substrate into a p-type emitter layer. Thus the variation in the total amount of dopant in the p-type emitter layer can be restricted to within 10%, and the variation in device characteristics can be restricted to a practically acceptable level. Hence the thickness of the p-type emitter layer is preferably 5 μm or more, and more preferably 10 μm or more.

On the other hand, under normal conditions, the electron diffusion length in the p-type emitter layer scarcely exceeds 50 μm. Hence, even if the p-type emitter layer is thickened beyond 50 μm, there is no increase in the effect of restricting the variation in injection efficiency γ due to the thickness variation of the p-type emitter layer, simply resulting in increasing the ON resistance. Therefore the thickness of the p-type emitter layer is preferably 50 μm or less.

When the p-type emitter layer has a dopant concentration of $1 \times 10^{18}$ cm$^{-3}$, for example, the diffusion coefficient D=7 cm$^2$/sec, and the lifetime t=$1 \times 10^{-6}$ sec. Hence L≈27 μm from the above equation (7). On the other hand, by experimental determination, the actual electron diffusion length in the p-type emitter layer is about 30 μm. When the p-type emitter layer is thickened to some extent, the current flowing during short circuit of load can be limited.

Dopant Concentration in the p-type Emitter Layer: $5 \times 10^{16}$ to $5 \times 10^{18}$ cm$^{-3}$ The dopant concentration in the n-type buffer layer is set lower than the dopant concentration in the p-type emitter layer. Hence the dopant concentration in the n-type buffer layer is lower than the carrier concentration in the n-type base layer upon passage of current, and injection efficiency γ is determined by the dopant concentration in the p-type emitter layer and the accumulated carrier concentration in the n-type base layer. As the current flowing in the IGBT increases, the concentration of carriers accumulated in the n-type base layer (electron concentration) increases, and hence the injection efficiency γ (the ratio of hole current to total current) generally decreases. If the dopant concentration in the p-type emitter layer is made lower than the accumulated carrier concentration during passage of large current, i.e., during occurrence of high current density, an appropriate γ value is spontaneously achieved because the increase of current density necessarily leads to the decrease of injection efficiency γ. Increasing the dopant concentration in the p-type emitter layer also results in increasing the carrier concentration, which is nearly saturated at $5 \times 10^{18}$ cm$^{-3}$. Hence, to restrict the γ value by adjusting the dopant concentration in the p-type emitter layer, the dopant concentration in the p-type emitter layer is preferably $5 \times 10^{18}$ cm$^{-3}$ or less, and more preferably $1 \times 10^{18}$ cm$^{-3}$ or less.

On the other hand, the dopant concentration in the p-type emitter layer needs to be not less than a certain concentration for achieving ohmic contact between the p-type emitter layer and the anode electrode and for passing large current in the p-type emitter layer. For a current density of 100 A cm$^{-2}$, carriers of about $2 \times 10^{16}$ cm$^{-3}$ are accumulated in the n-type base layer. Hence, to reduce voltage drop in the p-type emitter layer, the dopant concentration in the p-type emitter layer is preferably $2 \times 10^{16}$ cm$^{-3}$ or more, and more preferably $5 \times 10^{16}$ cm$^{-3}$ or more.

Therefore it is contemplated from the above discussion that the dopant concentration in the p-type emitter layer is preferably in the range of $2 \times 10^{16}$ to $1 \times 10^{18}$ cm$^{-3}$, and more preferably in the range of $5 \times 10^{16}$ to $1 \times 10^{18}$ cm$^{-3}$.

Note that the p-type emitter layer may have a two-layer structure composed of the above-described suitably thick p-type layer provided on the n-type buffer layer side and an extremely thin p$^+$-type layer provided on the anode electrode side. Here the lower surface of the thinned p-type substrate, i.e., the p-type emitter layer, is subjected to ion implantation, and then the p-type emitter layer is annealed. Thus a p$^+$-type layer is formed in the lower surface of the p-type emitter layer, and the portion of the p-type emitter layer other than the p$^+$-type layer serves as the p-type layer. These layers are configured so that the p$^+$-type layer has a smaller thickness and a higher dopant concentration than the p-type layer. Thus the ohmic resistance with the anode electrode can be reduced. The thickness of the p$^+$-type layer is preferably 0.3 μm or less, for example. In this case, because the p$^+$-type layer has a small amount of dopant and is distant from the n-type buffer layer, the ohmic resistance between the p-type emitter layer and the anode electrode can be exclusively improved without affecting the result of the above discussion.

In the following, the result of simulating the characteristics of the IGBT according to this embodiment is described.

In this simulation, on the basis of the IGBT configured as shown in FIG. 1, a plurality of IGBTs with the p-type emitter layer 2 being different in thickness and dopant concentration are assumed, and the characteristics of these IGBTs are calculated by a device simulator. The simulation result is described below.

Figure 13:
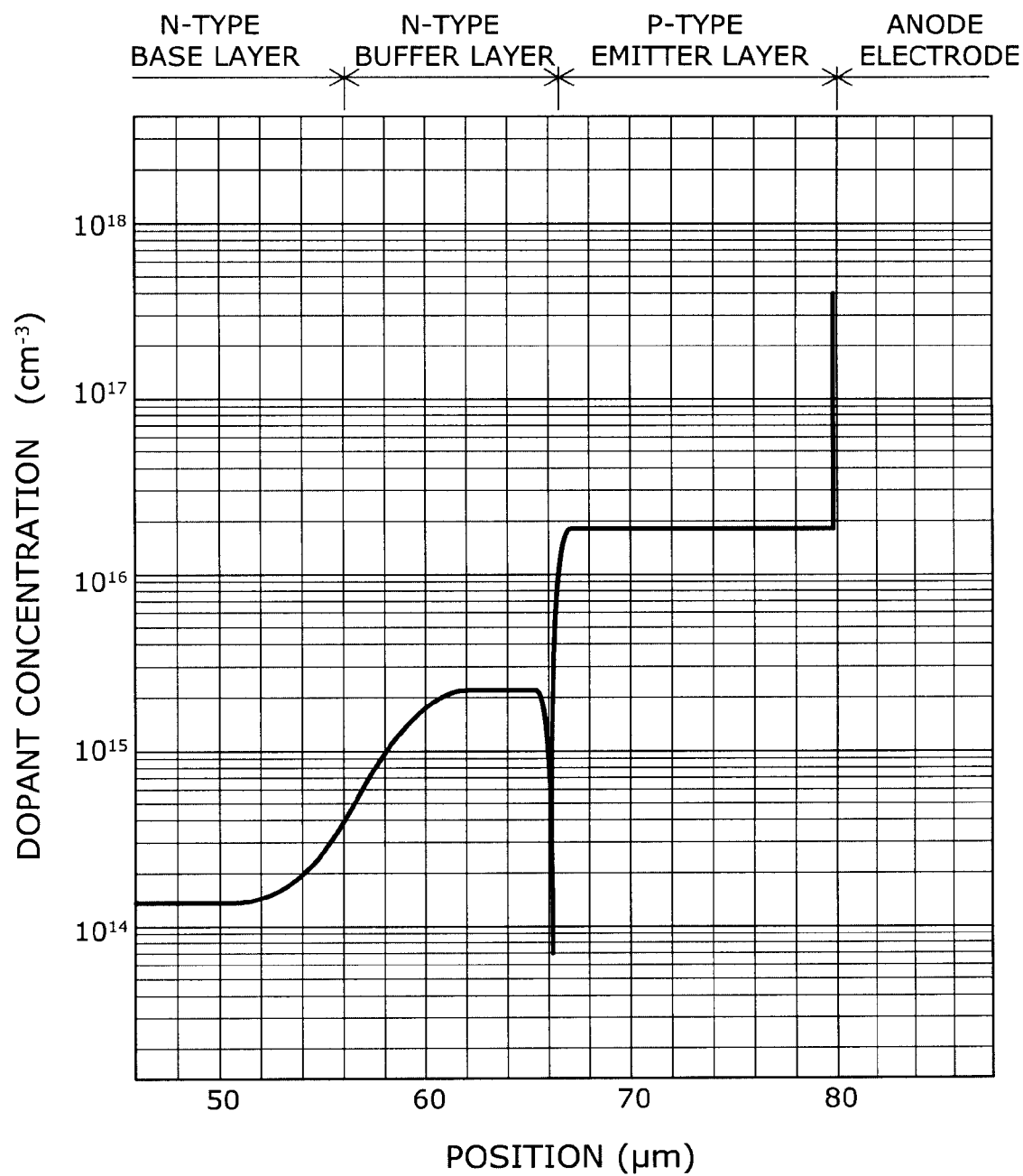
FIG. 13 is a graph illustrating the dopant concentration profile of one of the IGBTs configured in the simulation where the horizontal axis represents position along the current in the IGBT and the vertical axis represents dopant concentration.

FIG. 13 is a graph illustrating the dopant concentration profile of one of the IGBTs configured in this simulation where the horizontal axis represents position along the current in the IGBT and the vertical axis represents dopant concentration.

As shown in FIG. 13, in this IGBT, the p-type emitter layer 2 has a thickness of about 14 μm, and an extremely thin p$^+$-type layer having a thickness of about 0.2 μm and a dopant concentration of $1 \times 10^{18}$ cm$^{-3}$ is formed on the surface of the p-type emitter layer 2 on the side opposite to the n-type buffer layer 3. The portion of the p-type emitter layer 2 other than the p$^+$-type layer has a dopant concentration of about $2 \times 10^{16}$ cm$^{-3}$, the n-type buffer layer 3 has a dopant concentration of about $2 \times 10^{15}$ cm$^{-3}$, and the n-type base layer 4 has a dopant concentration of about $1.2 \times 10^{14}$ cm$^{-3}$. The dopant concentration profile shown in FIG. 13 is similar to the dopant concentration profile of actual products.

Figure 14A:
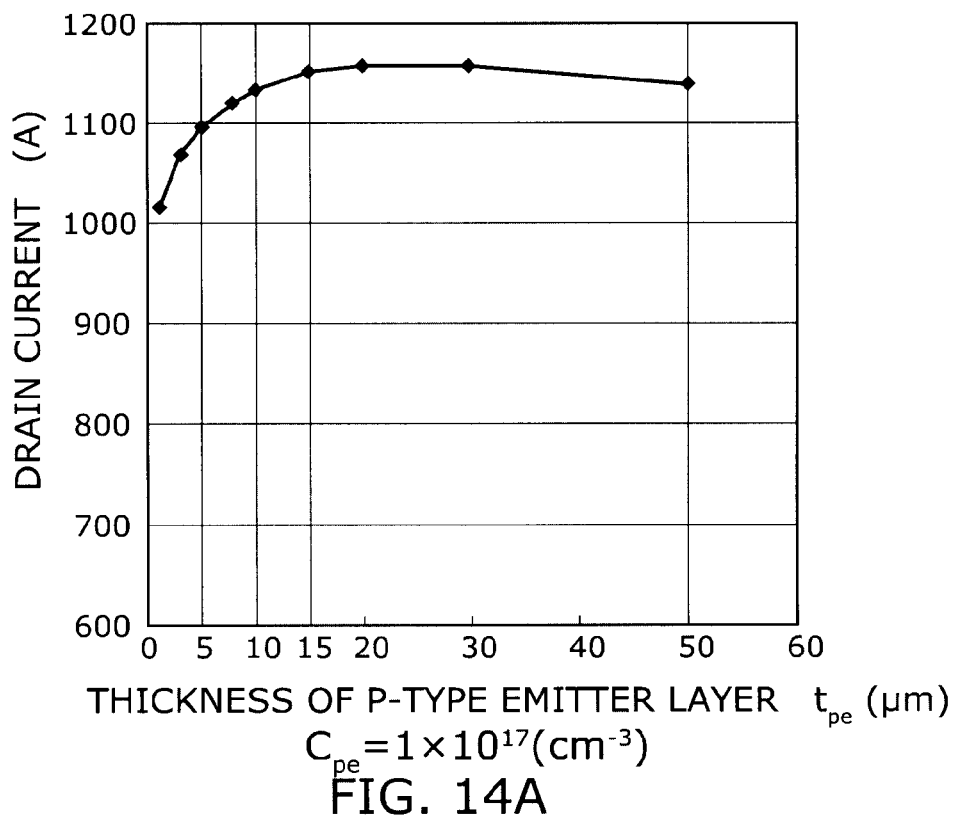
FIGS. 14A and 14B are graphs illustrating the effect of the thickness of the p-type emitter layer exerted on the current characteristics of an IGBT where the horizontal axis represents the thickness $t_{pe}$ of the p-type emitter layer and the vertical axis represents the magnitude of IGBT drain current.
Figure 14B:
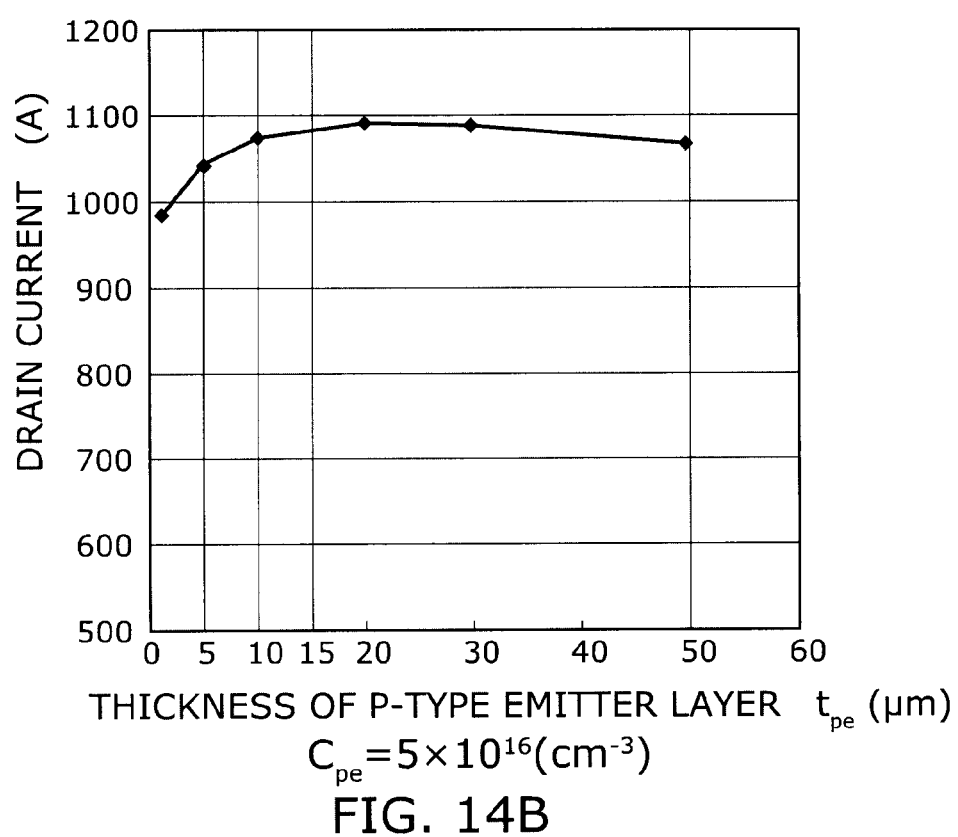

FIGS. 14A and 14B are graphs illustrating the effect of the thickness of the p-type emitter layer exerted on the current characteristics of an IGBT where the horizontal axis represents the thickness $t_{pe}$ of the p-type emitter layer and the vertical axis represents the magnitude of IGBT drain current. The dopant concentration $C_{pe}$ in the p-type emitter layer is $1 \times 10^{17}$ cm$^{-3}$ in FIG. 14A, and $5 \times 10^{16}$ cm$^{-3}$ in FIG. 14B.

The results shown in FIGS. 14A and 14B are obtained for a drain voltage of 3 V. As shown in FIGS. 14A and 14B, the magnitude of drain current depends on the thickness $t_{pe}$ of the p-type emitter layer. The drain current is maximized when the thickness $t_{pe}$ is about 20 μm. That is, the drain current increases with the increase of the thickness $t_{pe}$ in the range of 20 μm or less, whereas the drain current gradually decreases with the increase of the thickness $t_{pe}$ in the range of 20 μm or more. Furthermore, the smaller the thickness $t_{pe}$, the larger the rate of change of drain current for the thickness $t_{pe}$ in the range of 20 μm or less. That is, as the thickness $t_{pe}$ becomes smaller, the drain current is smaller and more susceptible to the thickness $t_{pe}$ of the p-type emitter layer, and hence unstable.

For the thickness $t_{pe}$ in the range of less than 5 μm, the drain current is small and has a large rate of change. In contrast, when the thickness $t_{pe}$ of the p-type emitter layer is in the range of 5 μm or more, the variation of drain current with respect to the thickness of the p-type emitter layer is small. When the thickness of the p-type emitter layer is in the range of 15 to 50 μm, the variation of drain current with respect to the thickness of the p-type emitter layer is sufficiently small. For the thickness $t_{pe}$ in the range of 20 μm or more, the drain current slightly decreases with the increase of the thickness $t_{pe}$ of the p-type emitter layer. However, this is presumably because of the increased resistance of the p-type emitter layer. The above trend remains almost unchanged even if the dopant concentration $C_{pe}$ in the p-type emitter layer varies. Furthermore, if the drain voltage is increased above 3 V, the variation of drain current decreases for the thickness $t_{pe}$ in the range of 20 μm or more. Hence, from the viewpoint of current characteristics, the thickness $t_{pe}$ of the p-type emitter layer needs to be 5 μm or more. To achieve a larger drain current more stably, the thickness $t_{pe}$ of the p-type emitter layer is preferably 10 μm or more, and more preferably 15 μm or more. On the other hand, to restrict the resistance of the p-type emitter layer, the thickness $t_{pe}$ of the p-type emitter layer is preferably 50 μm or less, and more preferably 30 μm or less.

Figure 15:
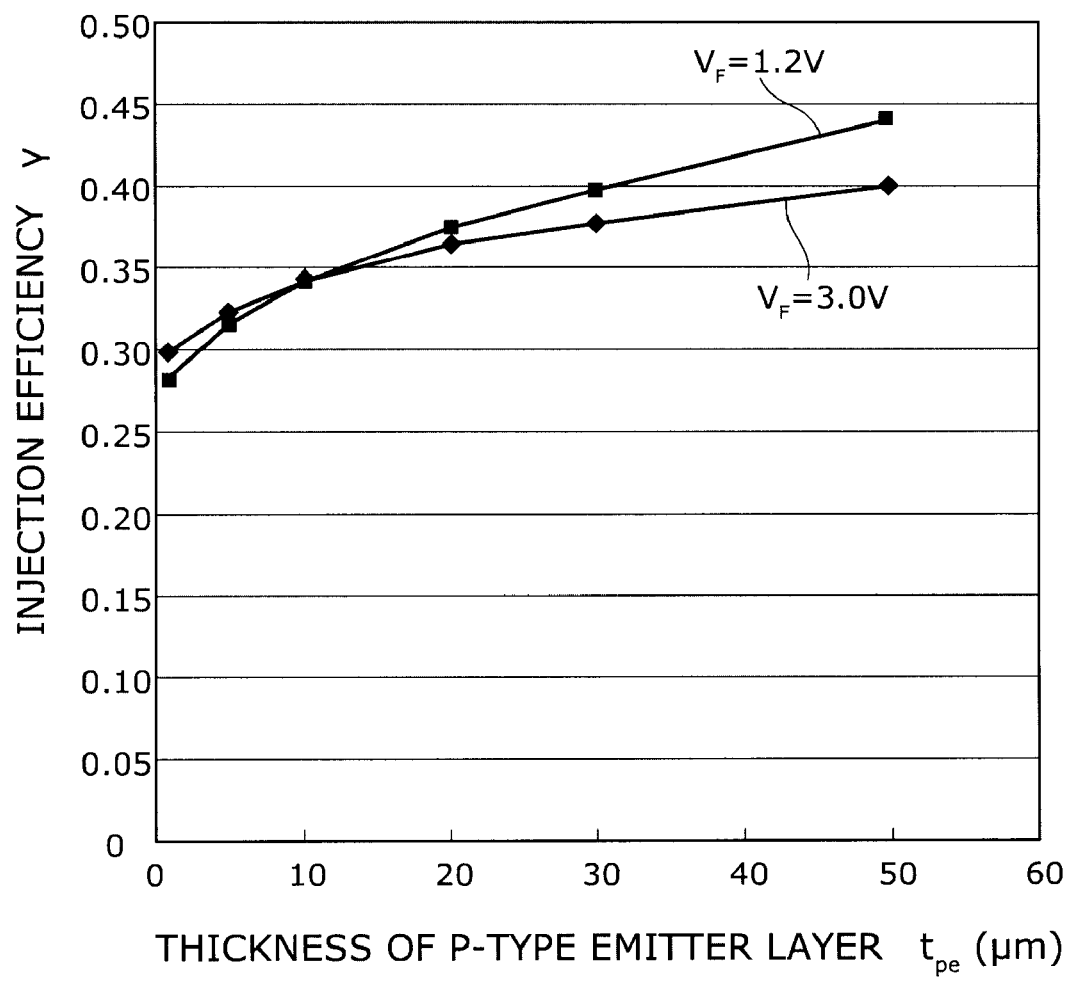
FIG. 15 is a graph illustrating the effect of the thickness $t_{pe}$ of the p-type emitter layer exerted on the injection efficiency of an IGBT where the horizontal axis represents the thickness $t_{pe}$ of the p-type emitter layer and the vertical axis represents the injection efficiency γ of the IGBT.

FIG. 15 is a graph illustrating the effect of the thickness $t_{pe}$ of the p-type emitter layer exerted on the injection efficiency of an IGBT where the horizontal axis represents the thickness $t_{pe}$ of the p-type emitter layer and the vertical axis represents the injection efficiency $\gamma$ of the IGBT. In FIG. 15, the dopant concentration $C_{pe}$ in the p-type emitter layer is $5 \times 10^{16}$ cm$^{-3}$, and the drain voltage $V_F$ is 3.0 V and 1.2 V.

As shown in FIG. 15, injection efficiency $\gamma$ depends on the thickness $t_{pe}$ of the p-type emitter layer. As the thickness $t_{pe}$ increases, the injection efficiency $\gamma$ also increases. This is presumably because the increase of the thickness of the p-type emitter layer causes the increase of the total amount of p-type dopant contained in the p-type emitter layer, which results in increased supply of holes. Furthermore, the rate of change of injection efficiency $\gamma$ also depends on the thickness $t_{pe}$, and increases as the thickness $t_{pe}$ decreases. As described above, to ensure a sufficient load short circuit SOA, the value of injection efficiency $\gamma$ is preferably in the range of 0.3 to 0.5. From FIG. 15, to achieve $\gamma$ of 0.3 or more, the thickness $t_{pe}$ of the p-type emitter layer needs to be 5 μm or more. On the other hand, the effect of improving injection efficiency $\gamma$ is saturated for the thickness $t_{pe}$ of 50 μm or more.

Figure 16:
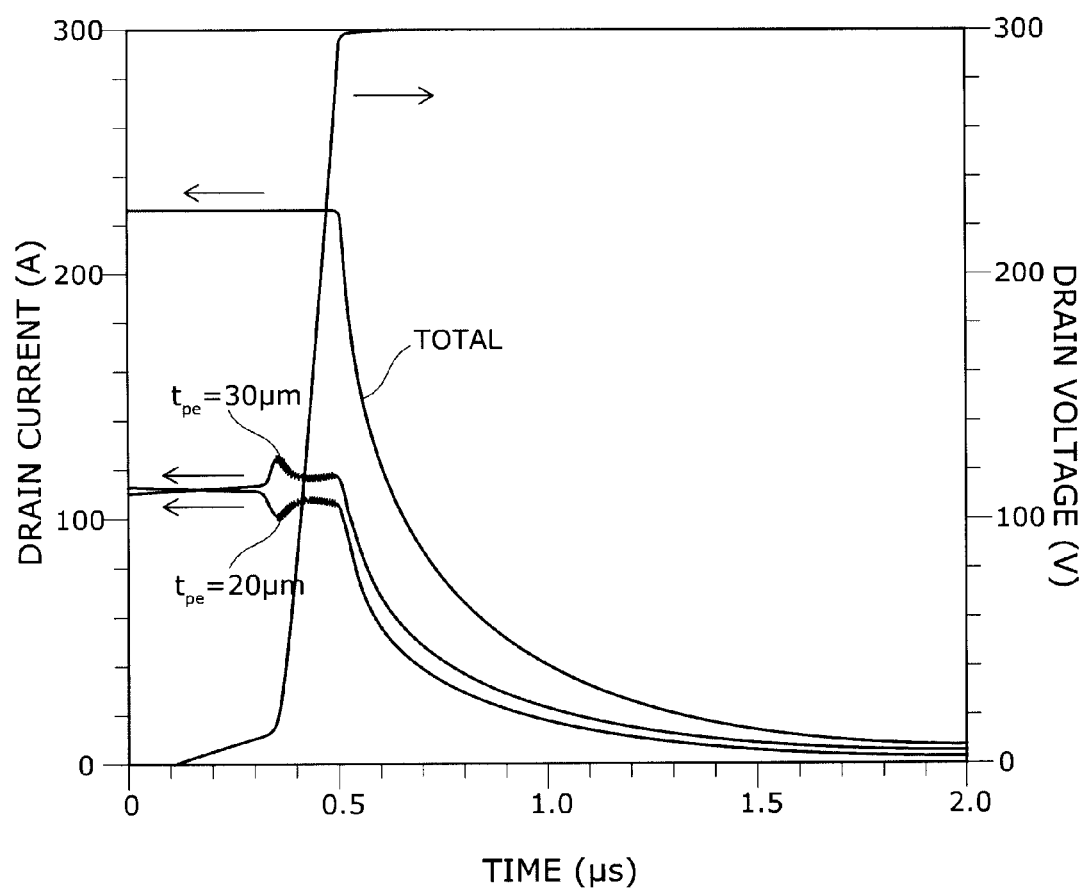
FIG. 16 is a graph illustrating the turn-off behavior of an IGBT where the horizontal axis represents time and the vertical axis represents drain current and drain voltage.

FIG. 16 is a graph illustrating the turn-off behavior of an IGBT where the horizontal axis represents time and the vertical axis represents drain current and drain voltage.

In this simulation, a chip with the thickness $t_{pe}$ of the p-type emitter layer being 20 μm and a chip with the thickness $t_{pe}$ being 30 μm are parallel connected to each other and simultaneously operated. FIG. 16 shows the drain current of the chip having a thickness $t_{pe}$ of 20 μm, the drain current of the chip having a thickness $t_{pe}$ of 30 μm, and the total drain current of these two chips.

As shown in FIG. 16, during transition where the gate potential is transitioned from positive to negative and the IGBT is switched from ON to OFF state, a difference occurs between the magnitude of drain current flowing in the chip having a thickness $t_{pe}$ of 20 μm and the magnitude of drain current flowing in the chip having a thickness $t_{pe}$ of 30 μm. This difference occurs because the two chips are different in the amount of carriers contained in the p-type emitter layer, and hence in the amount of charge ejected at turn-off time. However, while the chip having a thickness $t_{pe}$ of 30 μm has 50% more amount of dopant than the chip having a thickness $t_{pe}$ of 20 μm, the difference in the magnitude of drain current is considerably smaller than 50%. Thus no problem occurs if the two chips are parallel connected and simultaneously operated.

Figure 17A:
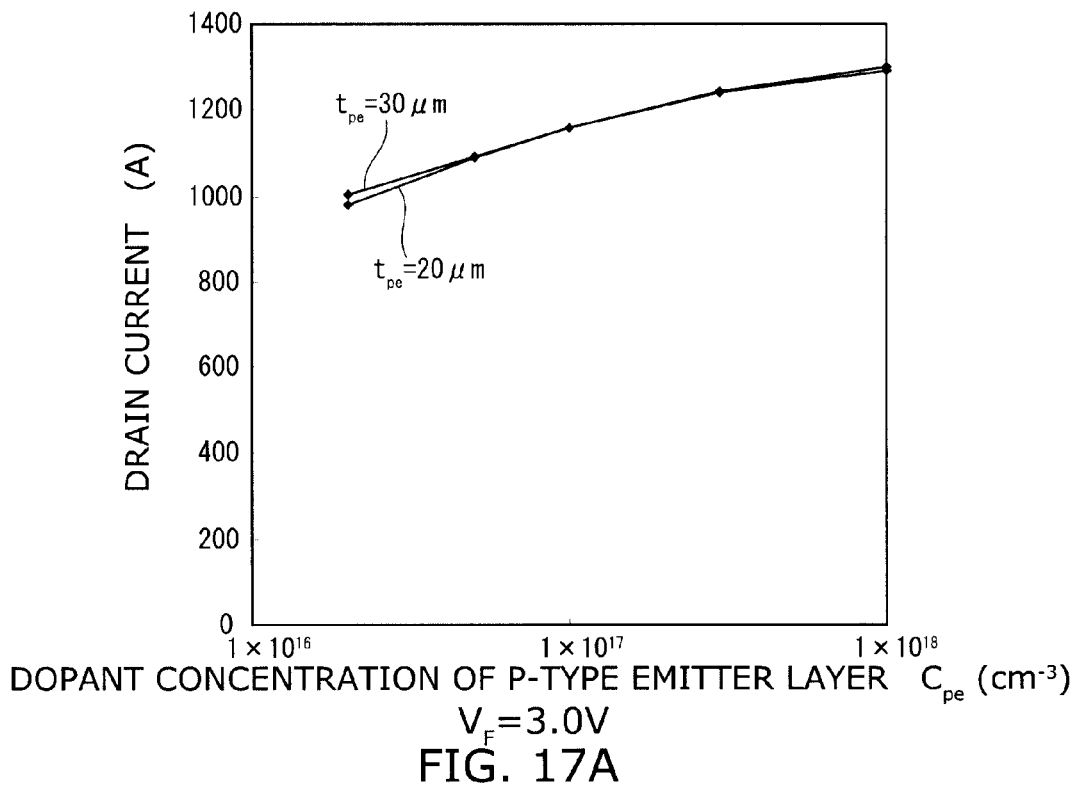
FIGS. 17A and 17B are graphs illustrating the effect of dopant concentration $C_{pe}$ in the p-type emitter layer exerted on the current characteristics of an IGBT where the horizontal axis represents dopant concentration $C_{pe}$ in the p-type emitter layer and the vertical axis represents drain current. The drain voltage $V_F$ is 3.0 V in FIG. 17A, and 1.2 V in FIG. 17B.
Figure 17B:
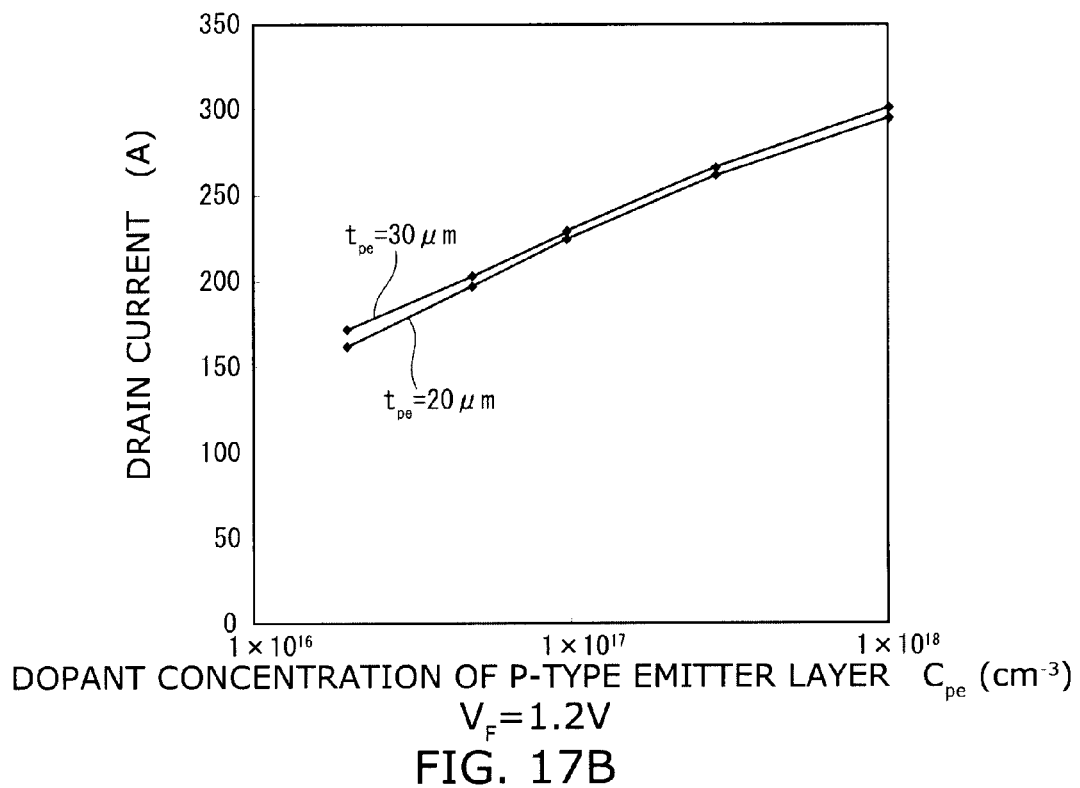

FIGS. 17A and 17B are graphs illustrating the effect of dopant concentration $C_{pe}$ in the p-type emitter layer exerted on the current characteristics of an IGBT where the horizontal axis represents dopant concentration $C_{pe}$ in the p-type emitter layer and the vertical axis represents drain current. The drain voltage $V_F$ is 3.0 V in FIG. 17A, and 1.2 V in FIG. 17B. FIGS. 17A and 17B each show the cases where the thickness $t_{pe}$ of the p-type emitter layer is 20 μm and 30 μm.

As shown in FIGS. 17A and 17B, the magnitude of drain current depends on the dopant concentration $C_{pe}$ in the p-type emitter layer, and increases as the value of $C_{pe}$ increases. On the other hand, when the dopant concentration $C_{pe}$ is in the range of $2 \times 10^{16}$ to $5 \times 10^{18}$ cm$^{-3}$, there is little difference in the magnitude of drain current between the cases where the thickness $t_{pe}$ of the p-type emitter layer is 20 μm and 30 μm. Hence, when the dopant concentration $C_{pe}$ in the p-type emitter layer is in the range of $2 \times 10^{16}$ to $1 \times 10^{18}$ cm$^{-3}$, the magnitude of drain current can be made generally constant by controlling the dopant concentration $C_{pe}$ to a constant value even if the thickness $t_{pe}$ of the p-type emitter layer varies to some extent.

Figure 18:
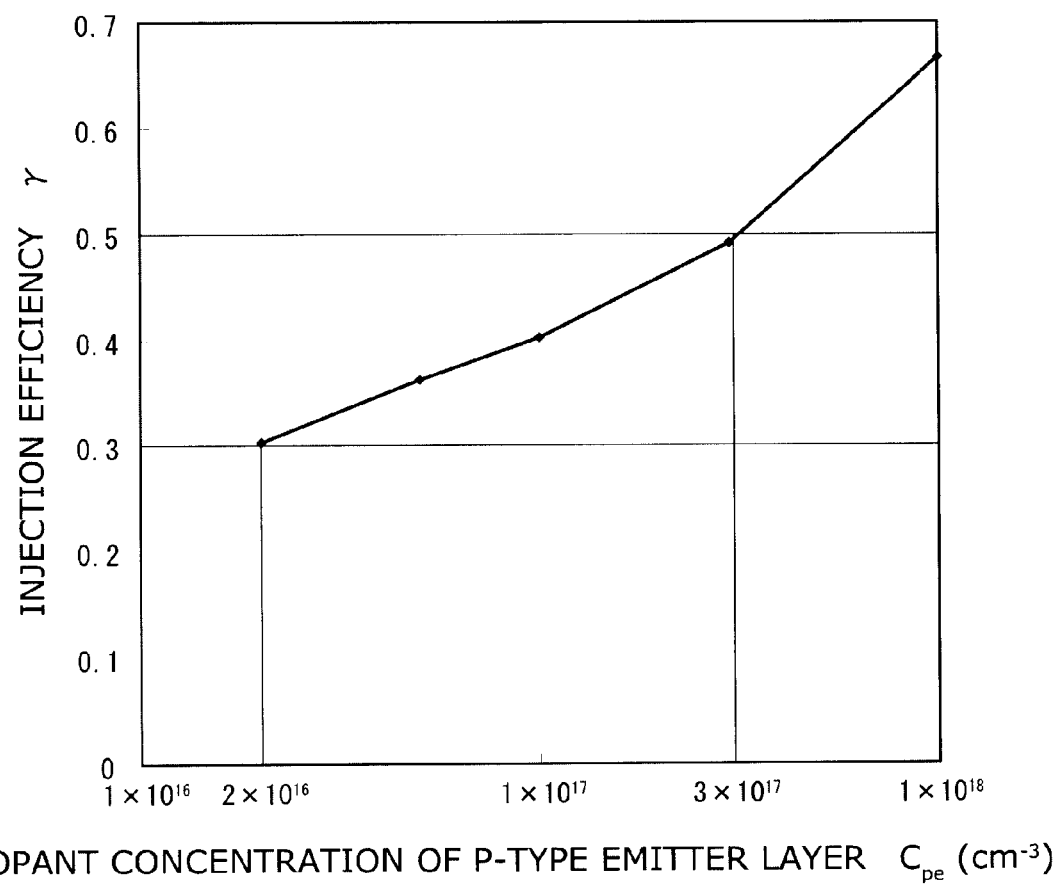
FIG. 18 is a graph illustrating the effect of dopant concentration $C_{pe}$ in the p-type emitter layer exerted on the injection efficiency of an IGBT where the horizontal axis represents dopant concentration $C_{pe}$ in the p-type emitter layer and the vertical axis represents injection efficiency γ.

FIG. 18 is a graph illustrating the effect of dopant concentration $C_{pe}$ in the p-type emitter layer exerted on the injection efficiency of an IGBT where the horizontal axis represents dopant concentration $C_{pe}$ in the p-type emitter layer and the vertical axis represents injection efficiency $\gamma$.

As shown in FIG. 18, the value of injection efficiency $\gamma$ depends on the dopant concentration $C_{pe}$, and increases with the increase of dopant concentration $C_{pe}$. This is because supply of holes increases as the dopant concentration $C_{pe}$ in the p-type emitter layer increases. As described above, from the viewpoint of the load short circuit SOA, the value of injection efficiency $\gamma$ is preferably 0.3 to 0.5. Hence, from FIG. 18, the dopant concentration $C_{pe}$ in the p-type emitter layer is preferably $2 \times 10^{16}$ to $3 \times 10^{17}$ cm$^{-3}$.

According to FIG. 18, if the dopant concentration $C_{pe}$ in the p-type emitter layer is increased from $4 \times 10^{16}$ cm$^{-3}$ to $1 \times 10^{17}$ cm$^{-3}$, the injection efficiency $\gamma$ increases from 0.35 to about 0.40. This variation corresponds to the variation obtained when the thickness $t_{pe}$ of the p-type emitter layer is increased from 15 μm to 30 μm as shown in FIG. 15.

Figure 19:
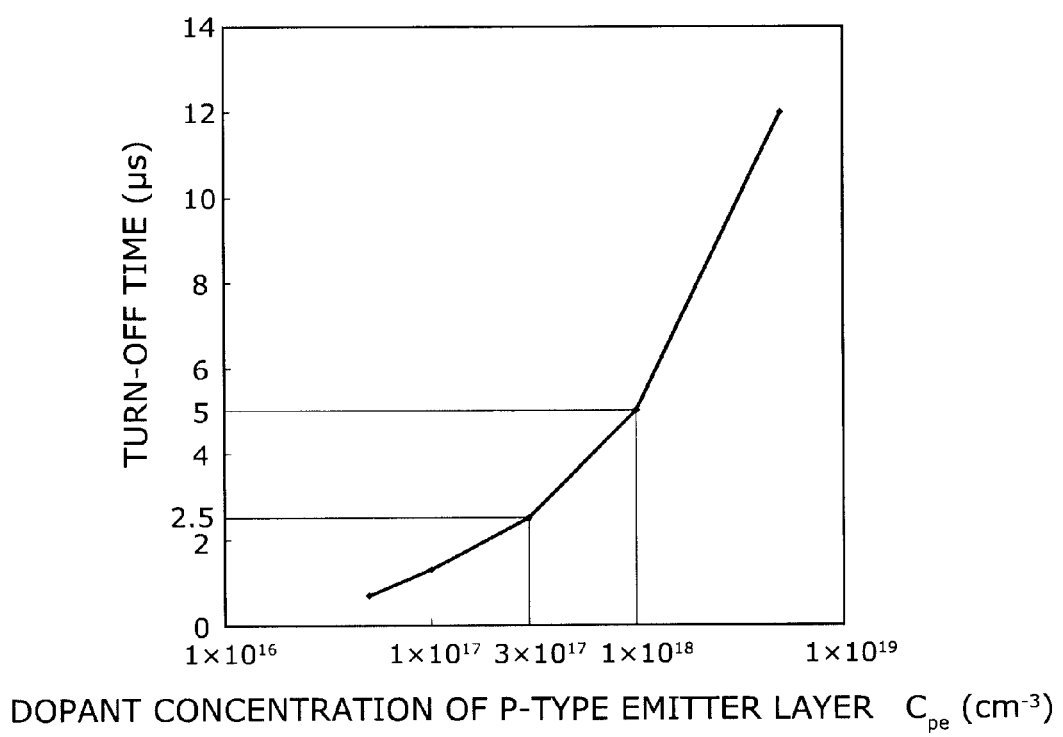
FIG. 19 is a graph illustrating the effect of dopant concentration in the p-type emitter layer exerted on the operating speed of an IGBT where the horizontal axis represents dopant concentration $C_{pe}$ in the p-type emitter layer and the vertical axis represents turn-off time.

FIG. 19 is a graph illustrating the effect of dopant concentration in the p-type emitter layer exerted on the operating speed of an IGBT where the horizontal axis represents dopant concentration $C_{pe}$ in the p-type emitter layer and the vertical axis represents turn-off time.

As shown in FIG. 19, the turn-off time, that is, the time elapsed until the drain current is turned off when the IGBT is switched from ON to OFF state, depends on the dopant concentration $C_{pe}$ in the p-type emitter layer, and increases as the concentration $C_{pe}$ increases. When the IGBT is operated at an operating speed required for typical applications, e.g., at a frequency of 1 kHz or more, one cycle has a duration of 1 ms (millisecond) or less. To ensure effective operating time for the device, the switching time is preferably 1% or less of one cycle. Hence the time available for switching is not more than 1% of one cycle (1 ms), i.e., 10 μs (microseconds). Furthermore, because switching includes turn-on and turn-off, the time available for one phase of switching, e.g., turn-off, is halved, i.e., 5 μs or less. From FIG. 19, to achieve a turn-off time of 5 μs or less, the dopant concentration $C_{pe}$ in the p-type emitter layer needs to be $1 \times 10^{18}$ cm$^{-3}$ or less. To accelerate the IGBT for suitable use in high-speed applications, preferably, the dopant concentration $C_{pe}$ is $3 \times 10^{17}$ cm$^{-3}$ or less, and the turn-off time is 2.5 μs or less.

From the above simulation result, the thickness $t_{pe}$ of the p-type emitter layer is preferably 5 to 50 μm, preferably 10 to 50 μm, more preferably 15 to 50 μm, and still more preferably 20 to 30 μm. The dopant concentration $C_{pe}$ in the p-type emitter layer needs to be $2 \times 10^{16}$ to $1 \times 10^{18}$ cm$^{-3}$, and is preferably $2 \times 10^{16}$ to $3 \times 10^{17}$ cm$^{-3}$. This simulation result is in substantial agreement with the result of the above discussion.

The result of the above discussion can be combined with this simulation result to derive the following thickness and dopant concentration for the p-type emitter layer. The thickness of the p-type emitter layer is 5 μm or more for ensuring a certain amount of drain current and reducing the dependence of drain current on the thickness of the p-type emitter layer. The thickness of the p-type emitter layer is preferably 10 μm or more, more preferably 15 μm or more, and still more preferably 20 μm or more. On the other hand, for restricting the increase of ON resistance, the thickness of the p-type emitter layer is 50 μm or less, and preferably 30 μm or less.

The dopant concentration in the p-type emitter layer is $2 \times 10^{16}$ cm$^{-3}$ or more for achieving an injection efficiency γ of 0.3 or more to suitably operate the device as an IGBT and to ensure a sufficient load short circuit SOA. On the other hand, the dopant concentration in the p-type emitter layer is $1 \times 10^{18}$ cm$^{-3}$ or less for ensuring a sufficient operating speed of the IGBT. Preferably, the dopant concentration in the p-type emitter layer is $3 \times 10^{17}$ cm$^{-3}$ or less for further increasing the operating speed of the IGBT and ensuring a sufficient load short circuit SOA.

Thus, the characteristics of the IGBT 1 (see FIG. 1) according to this embodiment have a relatively small dependence on the thickness of the p-type emitter layer 2 when the thickness of the p-type emitter layer 2 is in the range of 5 to 50 μm. Hence, fabrication of the IGBT permits some variation in the thickness of the p-type emitter layer 2, which facilitates fabricating a thin wafer PTIGBT. For example, an IGBT can be fabricated relatively easily by sequential epitaxial growth of a p-type emitter layer 2, an n-type buffer layer 3, and an n-type base layer 4 on a substrate, followed by forming an upper structure including a gate electrode 9, and then lapping away the substrate. Here, the variation in thickness of the p-type emitter layer 2 due to lapping does not lead to significant variation in IGBT characteristics. As a result, there is no need to use laser annealing for forming a highly doped p-type emitter layer.

By way of example, the target value of the dopant concentration in the p-type emitter layer 2 is set to $5 \times 10^{16}$ cm$^{-3}$, and its variation is controlled to within ±10%. Then, if the thickness of the p-type emitter layer 2 is successfully restricted to within the range of 25±4 μm, a thin wafer PTIGBT suitable for high-speed and large-current applications can be easily fabricated by the above epitaxial process without using laser annealing. Alternatively, the dose amount, which is given by the product of the thickness and the dopant concentration for the p-type emitter layer, may be controlled so that its variation is within ±25%.

Thus, according to this embodiment, a thin wafer IGBT can be realized without using a thin p-type emitter layer. Hence there is no variation in device characteristics due to the variation in thickness of the p-type emitter layer, and an IGBT with stable characteristics can be easily obtained.

The characteristics of the IGBT according to this embodiment are determined by the dopant concentration in the portion of the p-type emitter layer on the n-type buffer layer side. Here, in this embodiment, the p-type emitter layer is formed by thinning a p-type substrate predoped with p-type dopant. Hence the dopant concentration can be controlled more uniformly and precisely than in the method of thinning a wafer followed by doping the wafer with p-type dopant to form a p-type emitter layer. Thus an IGBT with stable characteristics can be fabricated.

Therefore, according to this embodiment, an IGBT with good characteristics can be manufactured with high yield.

The invention claimed is:

1. An insulated gate bipolar transistor comprising:
   a p-type emitter layer having a thickness of 5 to 50 μm and a dopant concentration of $2 \times 10^{16}$ to $1 \times 10^{18}$ cm$^{-3}$;
   an n-type buffer layer provided on the p-type emitter layer;
   an n-type base layer provided on the n-type buffer layer and having a higher resistivity than the n-type buffer layer;
   a p-type base layer provided in part of an upper surface of the n-type base layer;
   an n-type source layer provided in part of an upper surface of the p-type base layer;
   a trench extending through the n-type source layer and the p-type base layer to the n-type base layer;
   a gate electrode provided in the trench; and
   a gate insulating film provided between the gate electrode and an inner surface of the trench.

2. The insulated gate bipolar transistor according to claim 1, wherein the p-type emitter layer has a dopant concentration of $3 \times 10^{17}$ cm$^{-3}$ or less.

3. The insulated gate bipolar transistor according to claim 1, wherein the p-type emitter layer has a dopant concentration of $5 \times 10^{16}$ cm$^{-3}$ or more.

4. The insulated gate bipolar transistor according to claim 1, wherein the p-type emitter layer has a thickness of 10 μm or more.

5. The insulated gate bipolar transistor according to claim 4, wherein the p-type emitter layer has a thickness of 15 μm or more.

6. The insulated gate bipolar transistor according to claim 5, wherein the p-type emitter layer has a thickness of 20 to 30 μm.

7. The insulated gate bipolar transistor according to claim 1, wherein the p-type emitter layer is formed by thinning a p-type substrate containing p-type dopant.

8. The insulated gate bipolar transistor according to claim 7, wherein the p-type substrate uniformly contains the p-type dopant at a concentration of $2\times10^{16}$ to $1\times10^{18}$ cm$^{-3}$.

9. The insulated gate bipolar transistor according to claim 1, further comprising:
   a cathode electrode connected to the p-type base layer and the n-type source layer; and
   an anode electrode connected to the p-type emitter layer, wherein
   the p-type emitter layer includes:
      a low-concentration layer provided on the n-type buffer layer side, and
      a high-concentration layer provided on the anode electrode side and having a smaller thickness and a higher dopant concentration than the low-concentration layer.

10. The insulated gate bipolar transistor according to claim 1, wherein the ratio of hole current passing through an interface between the n-type buffer layer and the n-type base layer versus total current passing through the interface is 0.3 to 0.5.

11. An insulated gate bipolar transistor comprising:
   a p-type emitter layer;
   an n-type buffer layer provided on the p-type emitter layer;
   an n-type base layer provided on the n-type buffer layer and having a higher resistivity than the n-type buffer layer;
   a p-type base layer provided in part of an upper surface of the n-type base layer;
   an n-type source layer provided in part of an upper surface of the p-type base layer;
   a trench extending through the n-type source layer and the p-type base layer to the n-type base layer;
   a gate electrode provided in the trench; and
   a gate insulating film provided between the gate electrode and an inner surface of the trench, a ratio of hole current passing through an interface between the n-type buffer layer and the n-type base layer versus total current passing through the interface being 0.3 to 0.5.

12. The insulated gate bipolar transistor according to claim 11, wherein a current density of current passing through the interface is 10000 A/cm$^2$ or more, and the ratio is 0.430 to 0.457.

* * * * *